(12) United States Patent
Fujita et al.

(10) Patent No.: US 8,937,304 B2
(45) Date of Patent: Jan. 20, 2015

(54) SEMICONDUCTOR DEVICE AND ELECTRONIC DEVICE

(75) Inventors: Masashi Fujita, Tokyo (JP); Yutaka Shionoiri, Kanagawa (JP); Hiroyuki Tomatsu, Kanagawa (JP); Hidetomo Kobayashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 239 days.

(21) Appl. No.: 13/356,828

(22) Filed: Jan. 24, 2012

(65) Prior Publication Data

US 2012/0195115 A1 Aug. 2, 2012

(30) Foreign Application Priority Data

Jan. 28, 2011 (JP) ................... 2011-015871
May 14, 2011 (JP) ................... 2011-108880

(51) Int. Cl.
*H01L 27/108* (2006.01)
*G11C 11/34* (2006.01)
*H01L 21/84* (2006.01)
(Continued)

(52) U.S. Cl.
CPC ............ *H01L 21/84* (2013.01); *H01L 27/1156* (2013.01); *H01L 27/1203* (2013.01); *H01L 27/1222* (2013.01); *H01L 27/1225* (2013.01); *H01L 27/1251* (2013.01)
USPC ............................................ 257/43; 365/182

(58) Field of Classification Search
CPC ............ H01L 27/1251; H01L 27/1222; H01L 27/1203
USPC ............................. 365/182; 257/43, E27.084
See application file for complete search history.

(56) References Cited

U.S. PATENT DOCUMENTS 5,218,607 A 6/1993 Saito et al.
5,731,856 A 3/1998 Kim et al.
5,744,864 A 4/1998 Cillessen et al.
(Continued)

FOREIGN PATENT DOCUMENTS

CN 101335273 A 12/2008
EP 1 737 044 A1 12/2006
(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
(Continued)

*Primary Examiner* — Hoai V Ho
*Assistant Examiner* — Tri Hoang
(74) *Attorney, Agent, or Firm* — Fish & Richardson P.C.

(57) ABSTRACT

A first field-effect transistor provided over a substrate in which an insulating region is provided over a first semiconductor region and a second semiconductor region is provided over the insulating region; an insulating layer provided over the substrate; a second field-effect transistor that is provided one flat surface of the insulating layer and includes an oxide semiconductor layer; and a control terminal are provided. The control terminal is formed in the same step as a source and a drain of the second field-effect transistor, and a voltage for controlling a threshold voltage of the first field-effect transistor is supplied to the control terminal.

6 Claims, 29 Drawing Sheets

(51) Int. Cl.
*H01L 27/115* (2006.01)
*H01L 27/12* (2006.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,787,846 B2 | 9/2004 | Honda |
| 7,019,357 B2 | 3/2006 | Honda |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002590 A1 | 1/2009 | Kimura |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0193785 A1 | 8/2010 | Kimura |
| 2010/0220117 A1* | 9/2010 | Kimura ........................ 345/690 |
| 2011/0278564 A1 | 11/2011 | Yoneda |

FOREIGN PATENT DOCUMENTS

| | | |
|---|---|---|
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-291291 A | 10/1994 |
| JP | 08-264794 A | 10/1996 |
| JP | 09-107107 A | 4/1997 |
| JP | 11-505377 A | 5/1999 |
| JP | 2000-044236 A | 2/2000 |
| JP | 2000-150900 A | 5/2000 |
| JP | 2001-044441 A | 2/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2008-269751 A | 11/2008 |
| JP | 2010-003910 A | 1/2010 |
| JP | 2010-161382 A | 7/2010 |
| WO | 2004/114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

(56) References Cited

OTHER PUBLICATIONS

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

(56) References Cited

OTHER PUBLICATIONS

Kimizuka, N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

International Search Report, PCT Application No. PCT/JP2012/051484, dated Apr. 24, 2012, 3 pages.

Written Opinion, PCT Application No. PCT/JP2012/051484, dated Apr. 24, 2012, 5 pages.

* cited by examiner

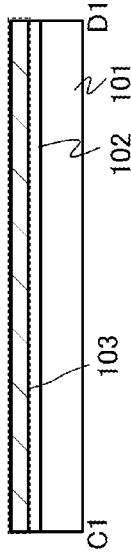
FIG. 2A1
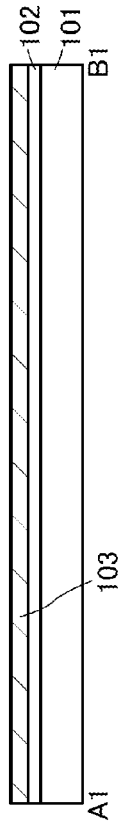
FIG. 2A2
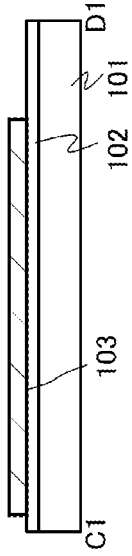
FIG. 2B1
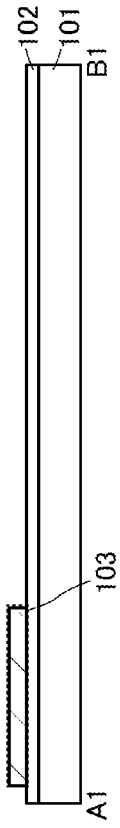
FIG. 2B2
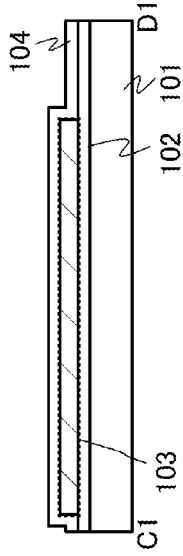
FIG. 2C1
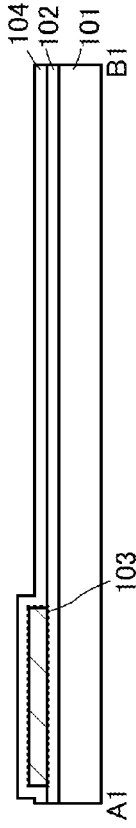
FIG. 2C2

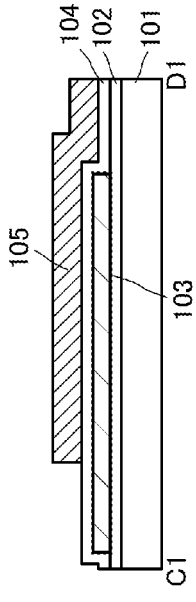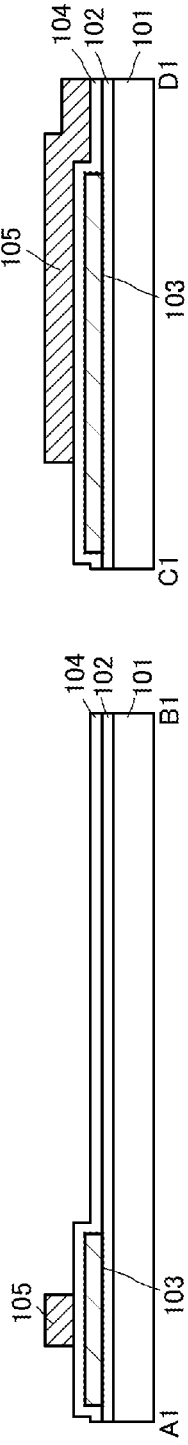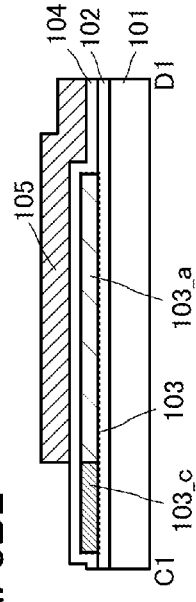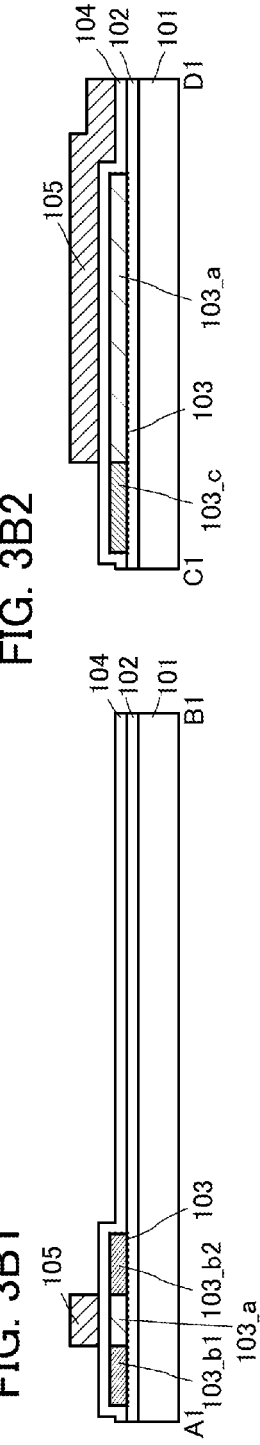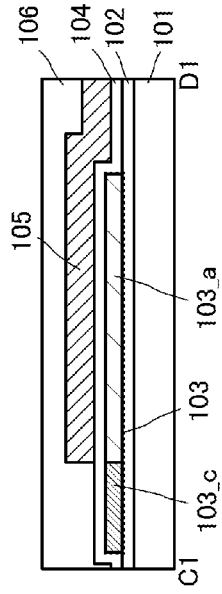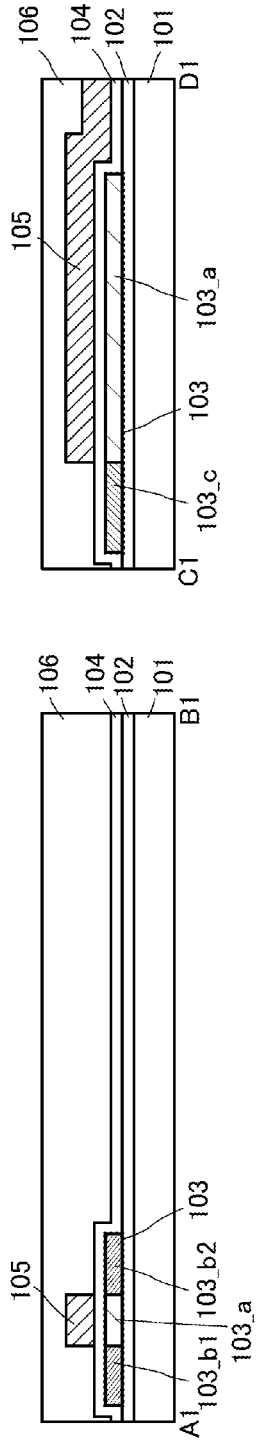

FIG. 4A1 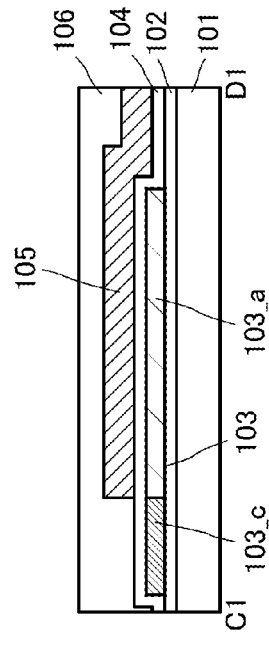
FIG. 4A2 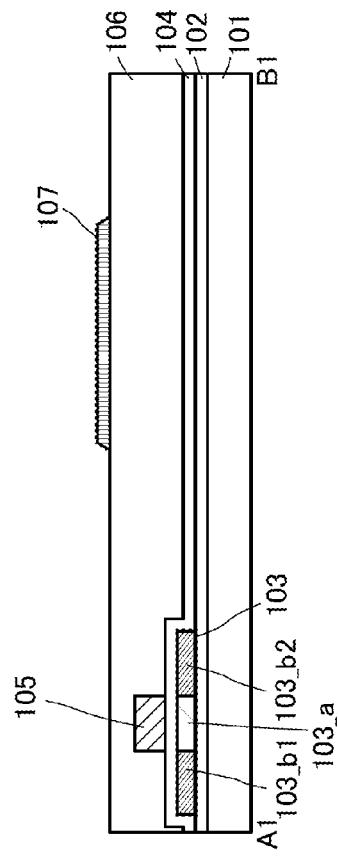
FIG. 4B1 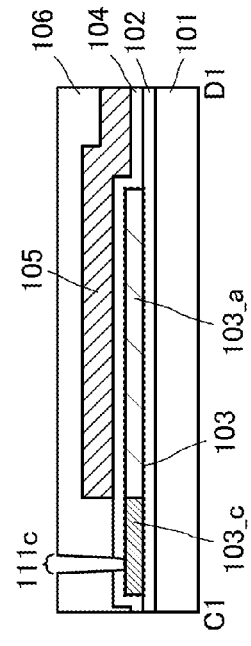
FIG. 4B2 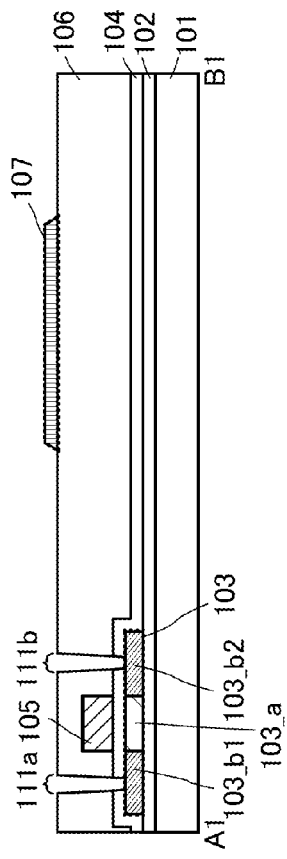

FIG. 5A1 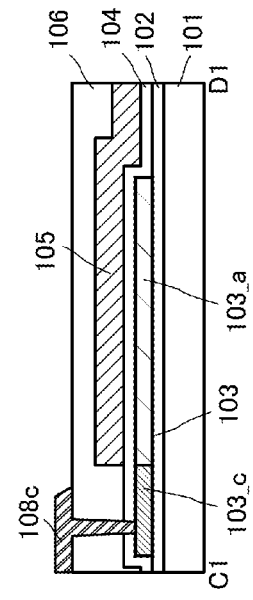 FIG. 5A2
FIG. 5B1 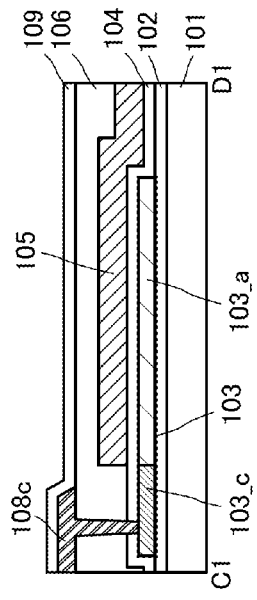 FIG. 5B2

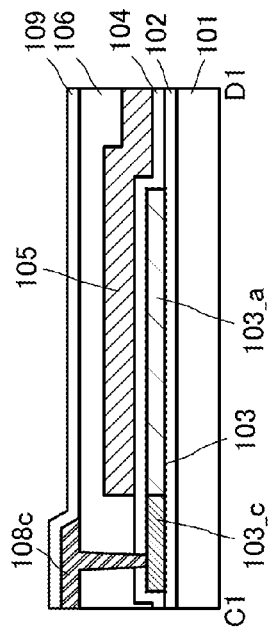
FIG. 6A2
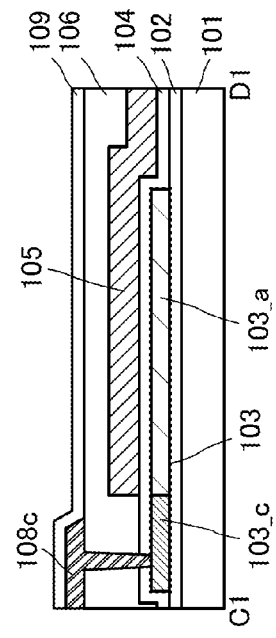
FIG. 6B2
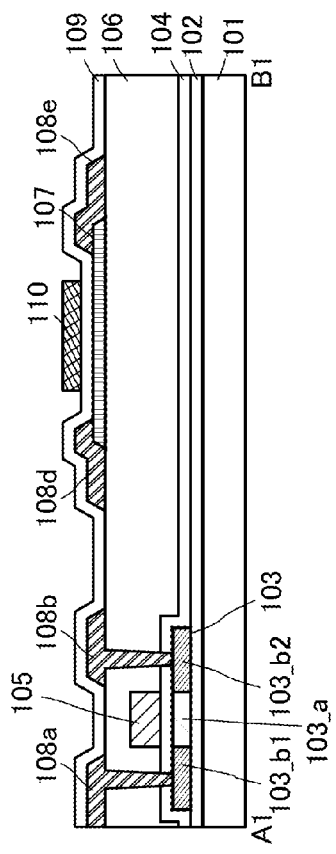
FIG. 6A1
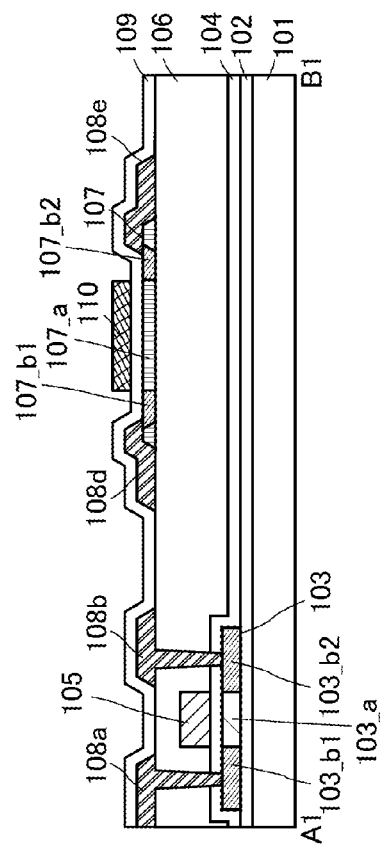
FIG. 6B1

STOP

RESTART

● In
☾ Sn
⌒ Zn
● O

FIG. 15A
FIG. 15B
FIG. 15C
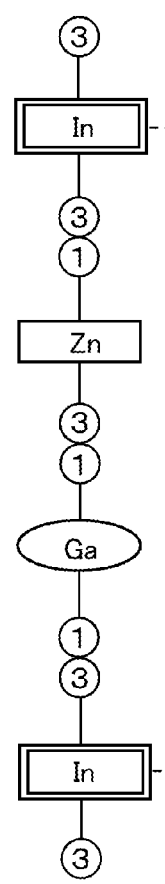
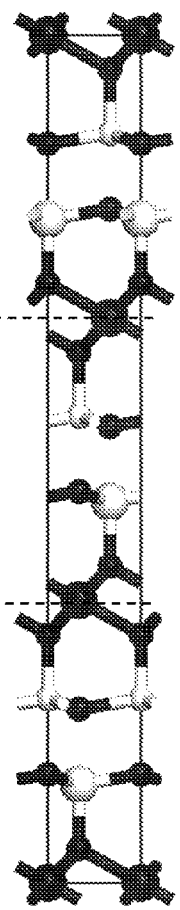
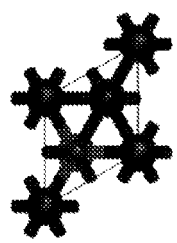
● In
● Ga
● Zn
● O

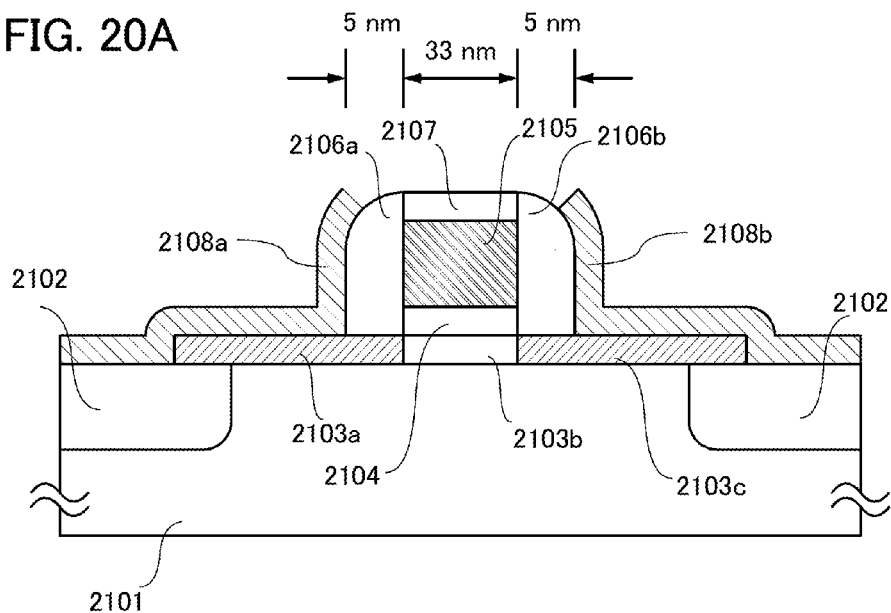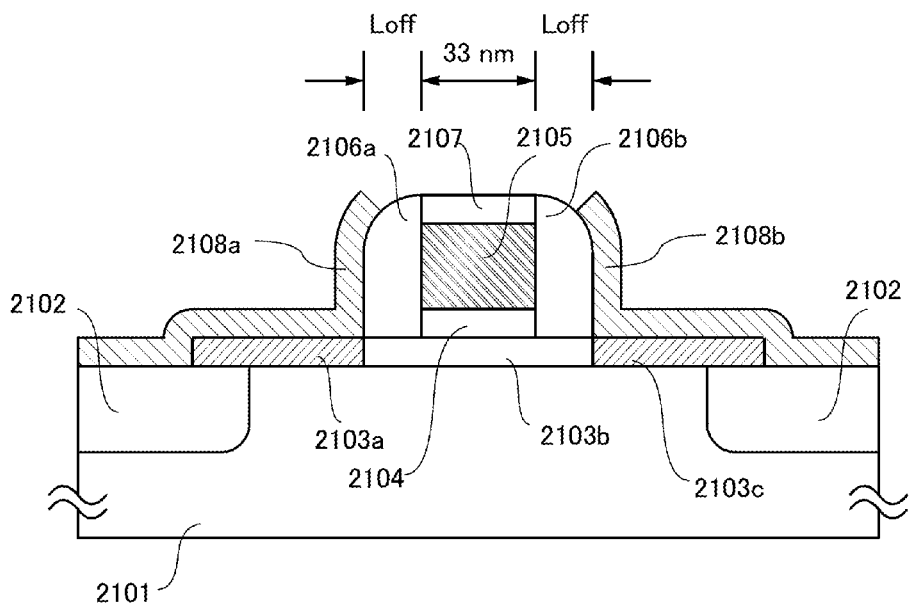

SEMICONDUCTOR DEVICE AND ELECTRONIC DEVICE

TECHNICAL FIELD

One embodiment of the present invention relates to a semiconductor device.

BACKGROUND ART

In recent years, the information society has been increasingly developed, and the demand for higher speed, higher capacity, smaller size, lighter weight, or the like of, for example, a personal computer, a cellular phone, or the like has been increased. Therefore, semiconductor devices such as a large-scale integrated circuit (also referred to as a large scale integration (LSI)) and a central processing unit (CPU) need higher integration, higher operation speed, and lower power consumption.

Power consumption of the semiconductor device is substantially equal to the total of a power consumption generated in an operation state and a power consumption generated in a stop state (hereinafter referred to as a standby power) of the semiconductor device.

The standby power can be classified into static standby power and dynamic standby power. The static standby power is power consumed by generation of leakage current between a source and a drain, between a gate and the source, and between the gate and the drain in a state where voltage is not applied between the electrodes of a transistor in the semiconductor device, that is, in a state where a voltage between the gate and the source is approximately 0 V. On the other hand, the dynamic standby power is power which is consumed when voltages of various signals such as a clock signal or a power supply voltage continues to be supplied to a circuit in standby state.

Although a microfabrication technique has been developed to obtain higher operation speed of a semiconductor device, when microfabrication is advanced, a channel of a transistor becomes smaller in length and an insulating layer typified by a gate insulating layer has a smaller thickness. Therefore, leakage current of the transistor is increased and the dynamic standby power tends to be increased. As a method for obtaining higher operation speed of a semiconductor device without microfabrication, a method is given in which a transistor is formed using a substrate in which an insulating region is provided over a first semiconductor region, and a second semiconductor region is provided over the insulating region (also referred to as an SOI substrate) (e.g., Patent Document 1).

REFERENCE

[Patent Document]
[Patent Document 1] Japanese Published Patent Application No. H6-291291

DISCLOSURE OF INVENTION

The standby power is increased as microfabrication advances and the integration degree is increased. Accordingly, in order to reduce the power consumption, it is important to reduce the standby power.

In the transistor using the SOI substrate, the first semiconductor region under the insulating region serves as a gate and a threshold voltage is shifted, that is, a back gate effect is caused. Therefore, even when a voltage applied between the gate and the source of the transistor is 0 V, there is a possibility that the amount of current flowing between the source and the drain of the transistor is increased and the power consumption of the semiconductor device is increased.

One object of one embodiment of the present invention is to suppress a reduction in operation speed and reduce power consumption.

In one embodiment of the present invention, a field-effect transistor provided on an SOI substrate and a field-effect transistor which includes an oxide semiconductor layer and has a low off-state current are provided in a semiconductor device, so that the operation speed is improved and the power consumption is reduced.

Further, in one embodiment of the present invention, a control terminal for controlling a threshold voltage of the field-effect transistor provided on the SOI substrate is provided, so that the threshold voltage of the field-effect transistor provided on the SOI substrate is controlled and the power consumption is reduced. At this time, the control terminal is formed in the same step as a source and a drain of the field-effect transistor including the oxide semiconductor layer, whereby an increase in the number of steps is suppressed.

Further, the control terminal is electrically connected to an impurity region formed in the second semiconductor region of the SOI substrate. The impurity region has a conductivity type opposite to that of a source region and a drain region of the field-effect transistor provided on the SOI substrate, and a voltage applied to a channel formation region is controlled in accordance with a voltage input via the control terminal. At this time, the impurity region may overlap with a channel formation region of the field-effect transistor including the oxide semiconductor layer, thereby functioning as a terminal (e.g., a back gate) for controlling a threshold voltage of the field-effect transistor including the oxide semiconductor layer. Accordingly, the threshold voltages of the field-effect transistor provided on the SOI substrate and the field-effect transistor including the oxide semiconductor layer can be controlled by the same control voltage so that power consumption is further reduced.

In addition, the control terminal may be electrically connected to an impurity region formed in the first semiconductor region of the SOI substrate. The impurity region overlaps with the channel formation region of the field-effect transistor provided on the SOI substrate with the insulating region provided therebetween, and thus, the voltage applied to the channel formation region is controlled by the voltage input via the control terminal.

One embodiment of the present invention is a semiconductor device including a bus interface, a control unit, a cache memory, N (N is a natural number greater than or equal to 3) registers, an instruction decoder, and an arithmetic logic unit. At this time, the field-effect transistor provided on the SOT substrate and the field-effect transistor including the oxide semiconductor layer are provided in a unit memory device in the register, and a data signal is input to one of the source and the drain of the field-effect transistor including the oxide semiconductor layer.

According to one embodiment of the present invention, a reduction in operation speed can be suppressed and the amount of current flowing between a source and a drain of a transistor which is in an off state can be reduced, which results in a reduction in power consumption.

BRIEF DESCRIPTION OF DRAWINGS

In the accompanying drawings:

FIGS. 2A1 to 2C2 illustrate an example of a method for manufacturing a semiconductor device in Embodiment 1;

FIGS. 3A1 to 3C2 illustrate the example of a method for manufacturing a semiconductor device in Embodiment 1;

FIGS. 4A1 to 4B2 illustrate the example of a method for manufacturing a semiconductor device in Embodiment 1;

FIGS. 5A1 to 5B2, illustrate the example of a method for manufacturing a semiconductor device in Embodiment 1;

FIGS. 6A1 to 6B2 illustrate the example of a method for manufacturing a semiconductor device in Embodiment 1;

FIGS. 15A to 15C illustrate the structure of an oxide material;

FIGS. 20A and 20B illustrate cross-sectional structures of transistors used for calculation;

BEST MODE FOR CARRYING OUT THE INVENTION

Figure 1A:
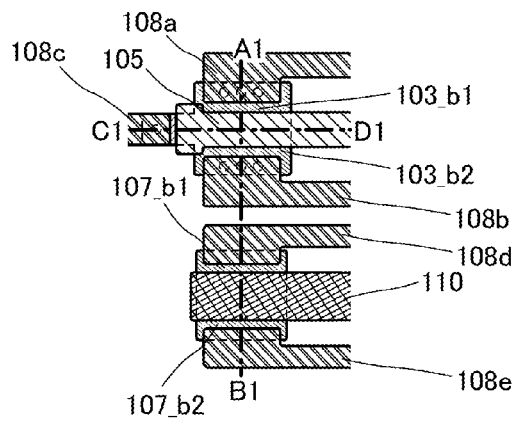
FIGS. 1A to 1C illustrate an example of the structure of a semiconductor device in Embodiment 1.

Examples of embodiments describing the present invention will be described with reference to the drawings below. Note that it is easy for those skilled in the art to change contents in an embodiment without departing from the spirit and the scope of the present invention. Thus, the present invention should not be limited to the description of the following embodiments.

Note that the contents in different embodiments can be combined with one another as appropriate. In addition, the contents in different embodiments can be interchanged one another.

Further, ordinal numbers such as "first" and "second" are added for avoiding confusion between components and the number of components is not limited to the number of ordinal numbers.

Note that the components illustrated in the drawings may include those having sizes different from the actual sizes for convenience.

Embodiment 1

In this embodiment, an example of a semiconductor device including a transistor which is provided on an SOI substrate and a transistor including an oxide semiconductor layer will be described.

A structure example of the semiconductor device in this embodiment is described with reference to FIGS. 1A to 1C. FIG. 1A is a schematic top view, FIG. 1B is a schematic cross-sectional view taken along line A1-B1 of FIG. 1A, and FIG. 1C is a schematic cross-sectional view taken along line C1-D1 of FIG. 1A.

Figure 1B:
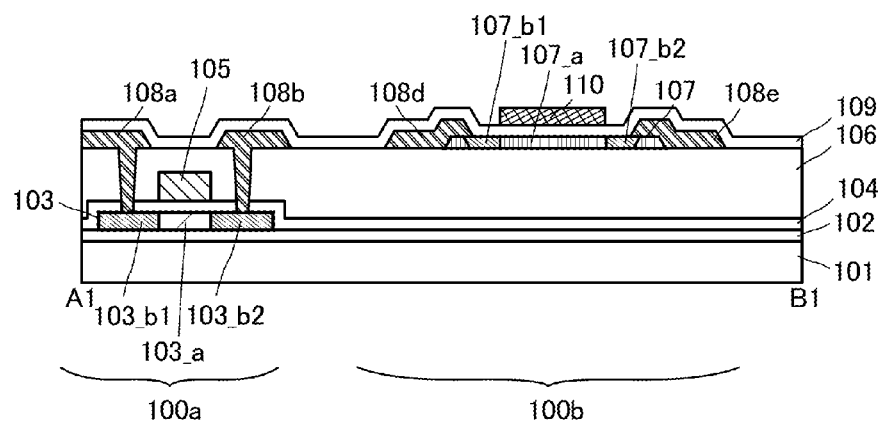
Figure 1C:
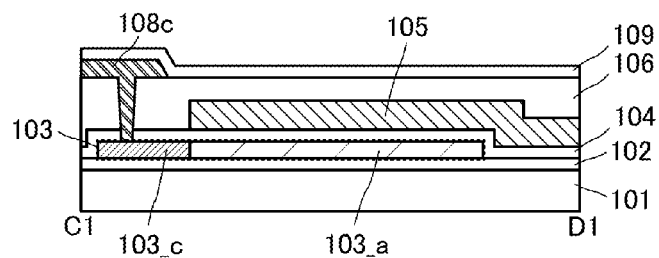

The semiconductor device illustrated in FIGS. 1A to 1C includes a semiconductor layer 101, an insulating layer 102, a semiconductor layer 103, an insulating layer 104, a conductive layer 105, an insulating layer 106, a semiconductor layer 107, conductive layers 108a to 108e, an insulating layer 109, and a conductive layer 110. A transistor 100a and a transistor 100b are formed using the above structure.

Note that, in the semiconductor device, a field-effect transistor can be used as the transistor, for example.

Depending on a structure or operation conditions of a transistor, a source and a drain of the transistor are interchanged in some cases.

Voltage generally refers to a difference between potentials at two points (also referred to as a potential difference). However, values of both a voltage and a potential are represented using volt (V) in a circuit diagram or the like in some cases, so that it is difficult to discriminate between them. This is why in this specification, a potential difference between a potential at one point and a potential to be the reference (also referred to as the reference potential) is used as a voltage at the point in some cases.

When a period in which two or more components are electrically connected to each other exists, it can be said that the two or more components are electrically connected to each other.

The transistor 100a is formed using a signal crystal semiconductor layer of silicon or the like, for example. The transistor 100a is used as a transistor of a logic circuit in the semiconductor device, for example.

The transistor 100b is a transistor including an oxide semiconductor layer whose off-state current is lower than that of a conventional transistor including a semiconductor layer of silicon or the like. The oxide semiconductor layer has a wider bandgap than silicon and is an intrinsic (i-type) or substantially intrinsic semiconductor layer. The off-state current per micrometer of the channel width of the transistor including the oxide semiconductor layer is lower than or equal to 10 aA ($1 \times 10^{-17}$ A), preferably lower than or equal to 1 aA ($1 \times 10^{-18}$ A), further preferably lower than or equal to 10 zA ($1 \times 10^{-20}$ A), further preferably lower than or equal to 1 zA ($1 \times 10^{-21}$ A), much further preferably lower than or equal to 100 yA ($1 \times 10^{-22}$ A). The transistor 100b is used as a transistor of a memory circuit, for example. Data is input to a portion where a source or a drain of the transistor 100b is electrically connected to another circuit or element, and then the transistor 100b is turned off, whereby the data can be retained for a long time. However, this embodiment is not limited thereto, and the transistor 100b can also be used for a logic circuit or the like.

The semiconductor layer 101 is a first semiconductor region in the SOI substrate. The semiconductor layer 101 is formed using a semiconductor substrate, for example. As the semiconductor substrate, for example, a silicon substrate or the like can be used.

The insulating layer 102 is provided over the semiconductor layer 101.

The insulating layer 102 is an insulating region in the SOI substrate. As the insulating layer 102, for example, a layer of a material such as silicon oxide can be used.

The semiconductor layer 103 is provided over the insulating layer 102.

The semiconductor layer 103 includes a region 103_a, a region 103_b1, a region 103_b2, and a region 103_c.

The region 103_a is a region between the region 103_b1 and the region 103_b2. The region 103_a is a region where a channel is formed (also referred to as a channel formation region).

The region 103_b1 and the region 103_b2 are apart from each other. The region 103_b1 is a region serving as one of a source region and a drain region of the transistor 100a, and the region 103_b2 is a region serving as the other of the source region and the drain region of the transistor 100a. The region 103_b1 and the region 103_b2 include an impurity element imparting n-type or p-type conductivity type. As the impurity element imparting n-type or p-type conductivity type, for example, phosphorus, boron, or the like can be used.

Further, the region 103_c is in contact with the region 103_a where the channel is formed and includes an impurity element imparting a conductivity type opposite to that of the region 103_b1 and the region 103_b2. At this time, the region 103_c has a conductivity type opposite to that of the region 103_b1 and the region 103b2. A voltage is applied to the region 103_a via the region 103_c. Further, the concentration of the impurity element added to the region 103_c is set higher than the concentration of the impurity element added to the region 103_a, whereby contact resistance with the region 103_a can be reduced.

The semiconductor layer 103 is at least part of a second semiconductor region in the SOI substrate. Note that the transistor 100a can also be formed in such a manner that a semiconductor region surrounded by an insulating region is used instead of the semiconductor layer 103.

The semiconductor layer 103 can be formed using, for example, a single crystal semiconductor layer, e.g., a layer of a material such as single crystal silicon.

The insulating layer 104 is provided over one flat surface of the semiconductor layer 103.

As the insulating layer 104, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer can be used, for example. The insulating layer 104 can also be formed by stacking layers of materials which can be applied to the insulating layer 104.

The insulating layer 104 functions as a gate insulating layer in the transistor 100a.

The conductive layer 105 overlaps with part of the semiconductor layer 103 (the region 103_a) with the insulating layer 104 provided therebetween.

As the conductive layer 105, a layer of a metal material such as aluminum, chromium, copper, tantalum, titanium, molybdenum, or tungsten; or an alloy material which contains any of the above metal materials as a main component can be used, for example. The conductive layer 105 can also be formed by stacking layers of materials which can be applied to the conductive layer 105.

The conductive layer 105 functions as a gate in the transistor 100a.

The insulating layer 106 is provided over the insulating layer 104 and the conductive layer 105.

As the insulating layer 106, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer can be used, for example. The insulating layer 106 can also be formed by stacking layers of materials which can be applied to the insulating layer 106.

The insulating layer 106 functions as a planarization insulating layer.

The semiconductor layer 107 is provided over one flat surface of the insulating layer 106.

The semiconductor layer 107 includes a region 107_a. Further, a region 107_b1 and a region 107_b2 are provided in the semiconductor layer 107 as illustrated in FIGS. 1A and 1B but are not necessarily provided.

The region 107_a is a region between the region 107_b1 and the region 107_b2. The region 107_a is a channel formation region of the transistor 100b.

The region 107_b1 and the region 107_b2 are apart from each other and include an element serving as a dopant. As the dopant, for example, one or more of elements of Group 15 in the periodic table (e.g., one of more of nitrogen, phosphorus, arsenic) and one or more of rare gas elements (e.g., one or more of helium, argon, xenon) can be used. When the dopants are added to form regions functioning as a source region and a drain region, even in the case where the area of the transistor is small, a resistance value between the source or drain and the channel formation region of the transistor can be reduced. Thus, the area of a circuit of the semiconductor device can be reduced.

As the semiconductor layer 107, an oxide semiconductor layer containing a four-component metal oxide, a three-component metal oxide, a two-component metal oxide, a single-component metal oxide, or the like can be used, for example.

An oxide semiconductor to be used preferably contains at least indium (In) or zinc (Zn). In particular, In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, as the four-component metal oxide, an In—Sn—Ga—Zn—O-based metal oxide, an In—Hf—Ga—Zn—O-based metal oxide, an In—Al—Ga—Zn—O-based metal oxide, an In—Sn—Al—Zn—O-based metal oxide, an In—Sn—Hf—Zn—O-based metal oxide, an In—Hf—Al—Zn—O-based metal oxide, or the like can be used.

As the oxide of three metal elements, an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Hf—Zn—O-based metal oxide, an In—La—Zn—O-based metal oxide, an In—Ce—Zn—O-based metal oxide, an In—Pr—Zn—O-based metal oxide, an In—Nd—Zn—O-based metal oxide, an In—Sm—Zn—O-based metal oxide, an In—Eu—Zn—O-based metal oxide, an In—Gd—Zn—O-based metal oxide, an In—Tb—Zn—O-based metal oxide, an In—Dy—Zn—O-based metal oxide, an In—Ho—Zn—O-based metal oxide, an In—Er—Zn—O-based metal oxide, an In—Tm—Zn—O-based metal oxide, an In—Yb—Zn—O-based metal oxide, or an In—Lu—Zn—O-based metal oxide can be used, for example.

As the two-component metal oxide, an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, an In—Sn—O-based metal oxide, or an In—Ga—O-based metal oxide can be used, for example.

Note that an In—Ga—Zn—O-based metal oxide, refers to a metal oxide whose main components are In, Ga, and Zn, and there is no particular limitation on the ratio of In:Ga:Zn. The In—Ga—Zn—O-based oxide may contain a metal element other than the In, Ga, and Zn.

In the case of using an In—Zn—O-based metal oxide, for example, an oxide target which has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 ($In_2O_3$:ZnO=15:2 to 3:4 in a molar ratio) can be used for formation. For example, when the atomic ratio of the target used for the deposition of the In—Zn—O-based oxide semiconductor is expressed by In:Zn:O=P:Q:R, R>1.5P+Q. An increase in the amount of indium enables mobility of the transistor to increase.

Further, in the case of an In—Sn—Zn—O-based metal oxide, an oxide target having a composition ratio of In:Sn:Zn=1:2:2, In:Sn:Zn=2:1:3, In:Sn:Zn=1:1:1, In:Sn:Zn=20:45:35, or the like is used.

Alternatively, as the semiconductor layer 107, a layer of an I—O-based metal oxide, a Sn—O-based metal oxide, a Zn—O-based metal oxide, or the like can be used, for example. Further, the metal oxide that can be used as the oxide semiconductor may contain silicon oxide. Alternatively, the metal oxide that can be used as the oxide semiconductor may contain nitrogen.

Alternatively, as the semiconductor layer 107, a layer of a material represented by $InLO_3(ZnO)_l$ (l is larger than 0 and is not an integer) can be used. Here, L in $InLO_3(ZnO)_l$ represents one or more metal elements selected from Ga, Fe, Al, Mn, or Co. As the oxide semiconductor, a layer of a material represented by $In_3SnO_5(ZnO)_n$ (n is larger than 0 and is an integer) can also be used.

For example, an In—Ga—Zn—O-based metal oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn—O-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, without limitation to the materials given above, a material with an appropriate composition may be used depending on desired semiconductor characteristics (e.g., mobility, threshold voltage, and variation). In order to obtain the needed semiconductor characteristics, it is preferable that the carrier concentration, the impurity concentration, the defect density, the atomic ratio of a metal element to oxygen, the interatomic distance, the density, and the like be set to be appropriate.

For example, high mobility can be obtained relatively easily in the case where the In—Sn—Zn—O-based metal oxide is used. However, the mobility can be increased by reducing the defect density in the bulk also in the case where the In—Ga—Zn—O-based metal oxide is used.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when a surface flatness is improved, mobility higher than that of an oxide semiconductor layer in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

Note that, Ra is obtained by three-dimension expansion of center line average roughness that is defined by JIS B 0601 so as to be applied to a plane. The Ra can be expressed as an "average value of the absolute values of deviations from a reference surface to a specific surface" and is defined by the formula below.

$$Ra = \frac{1}{S_0} \int_{y_1}^{y_2} \int_{x_1}^{x_2} |f(x, y) - Z_0| dx dy \qquad \text{[Formula 1]}$$

In the above formula, $S_0$ represents an area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. Ra can be measured using an atomic force microscope (AFM). Note that the measurement plane is a plane which is shown by all the measurement data, and the measurement data consists of three parameters (x, y, z) and is represented by z=f(x, y). The range of x (and y) is from 0 to $x_{max}$ (and $y_{max}$), and the range of z is from $z_{min}$ to $z_{max}$.

At least the region of the semiconductor layer 107 where the channel is formed may be non-single-crystal and includes a phase which has a triangular, hexagonal, regular triangular, or regular hexagonal atomic arrangement when seen from the direction perpendicular to the a-b plane and in which metal atoms are arranged in a layered manner when seen from the direction perpendicular to the c-axis direction or metal atoms and oxygen atoms are arranged in a layered manner when seen from the direction perpendicular to the c-axis direction. The formation of the above phase makes it possible to suppress degradation of the transistor due to light. Note that the material having the phase is also referred to as a c-axis aligned crystal or CAAC.

The conductive layer 108a is electrically connected to the region 103_b1 via a first opening which penetrates the insulating layer 104 and the insulating layer 106.

The conductive layer 108a functions as one of the source and the drain of the transistor 100a.

The conductive layer 108b is electrically connected to the region 103_b2 via a second opening which penetrates the insulating layer 104 and the insulating layer 106.

The conductive layer 108b functions as the other of the source and the drain of the transistor 100a.

The conductive layer 108c is electrically connected to the region 103_c via a third opening which penetrates the insulating layer 104 and the insulating layer 106.

The conductive layer 108c functions as a control terminal for controlling a voltage applied to the region 103_a of the transistor 100a.

The conductive layer 108d is electrically connected to the semiconductor layer 107.

The conductive layer 108d functions as one of a source and a drain of the transistor 100b.

The conductive layer 108e is electrically connected to the semiconductor layer 107.

The conductive layer 108e functions as the other of the source and the drain of the transistor 100b.

Note that although the conductive layer 108d and the conductive layer 108e are provided over the semiconductor layer 107 as illustrated in FIGS. 1A and 1B, this embodiment is not limited thereto, and the semiconductor layer 107 may be provided over the conductive layer 108d and the conductive layer 108e.

The conductive layer 108c is formed in the same step as the conductive layer 108d and the conductive layer 108e. In addition, the conductive layer 108a and the conductive layer 108b may be formed in the same step as the conductive layer 108c to the conductive layer 108e. Each of the conductive layers 108a to 108e can be formed using, for example, a layer of a metal material such as aluminum, chromium, copper, tantalum, titanium, molybdenum, or tungsten; or an alloy material which contains any of the above metal materials as a main component. As the layer of the alloy material, for example, a layer of a Cu—Mg—Al alloy material can be used.

Further, a layer including a conductive metal oxide can be used as each of the conductive layers 108a to 108e. Note that the conductive metal oxide which can be used for each of the conductive layers 108a to 108e may include silicon oxide.

The conductive layers 108a to 108e can also be formed by stacking layers of materials which can be applied to the conductive layers 108a to 108e. For example, the conductive layers 108a to 108e are each formed with a stack in which a copper layer is provided over a layer of a Cu—Mg—A1 alloy material, whereby adhesion between the conductive layers 108a to 108e and other layers in contact with the conductive layers 108a to 108e can be increased.

The insulating layer 109 is provided over the insulating layer 106, the semiconductor layer 107, and the conductive layers 108a to 108e.

A silicon oxide layer can be used as the insulating layer 109, for example. Alternatively, the insulating layer 109 can be formed using a stack of a silicon oxide layer and another layer.

The conductive layer 110 overlaps with the semiconductor layer 107 with the insulating layer 109 provided therebetween.

The conductive layer 110 can be, for example, a layer of a metal material such as aluminum, chromium, copper, tantalum, titanium, molybdenum, or tungsten; or an alloy material which contains any of the above metal materials as a main component.

In the semiconductor device illustrated in FIGS. 1A to 1C, a control voltage is applied via the conductive layer 108c serving as the control terminal. Then, a voltage of the region 103_a can be controlled to be a level in accordance with the control voltage. For example, in the case where the transistor 100a is a p-channel transistor, when the level of the control voltage is increased, a threshold voltage of the transistor 100a is negatively shifted. Thus, even in the case where the threshold voltage of the transistor 100a varies owing to the semiconductor layer 101, when the control voltage is input via the conductive layer 108c to control the voltage of the region 103_a and the threshold voltage of the transistor 100a, whereby the amount of current flowing between the source and the drain of the transistor 100a which is in an off state can be reduced. The threshold voltage of the transistor 100a is preferably controlled so that the transistor 100a becomes an enhancement type transistor, for example.

Note that when the transistor 100a and the transistor 100b have the same conductivity type, the region 103_c may overlap with the channel formation region of the transistor 100b, so that threshold voltage of the transistor 100a and a threshold voltage of the transistor 100b may be controlled by a common control voltage. In that case, the number of signals can be reduced, whereby the number of wirings can be reduced.

Further, another transistor having a different conductivity type from the transistor 100a may be provided on the SOI substrate. At this time, the transistor having the different conductivity type from the transistor 100a can have the same structure as the transistor 100a except that a conductivity type of an impurity region is different from that of the transistor 100a. Accordingly, the transistor having the different conductivity type can be formed while an increase in the number of manufacturing steps is suppressed.

This is the example of the semiconductor device in this embodiment.

In the example of the semiconductor device in this embodiment, a field-effect transistor provided on an SOI substrate and a field-effect transistor including an oxide semiconductor layer are used. The use of the transistors enables an improvement in operation speed and a reduction in unnecessary current, thereby reducing power consumption.

Further, in the example of the semiconductor device in this embodiment, a control terminal for controlling a threshold voltage of the field-effect transistor provided on the SOI substrate is provided, and the threshold voltage of the field-effect transistor provided on the SOI substrate is controlled. As a result, it is possible to reduce the amount of current flowing between a source and a drain of the field-effect transistor which is provided on the SOI substrate and is in an off state, so that the power consumption of the semiconductor device can be reduced. Further, the threshold voltages of n-channel transistors or p-channel transistors which are provided on the SOI substrate and have the above structure can be each controlled.

Further, in the example of the semiconductor device in this embodiment, a conductive layer functioning as the control terminal can be formed in the same step as the source and the drain of the field-effect transistor including an oxide semiconductor layer. As a result, an increase in the number of manufacturing steps can be suppressed.

An example of a method for manufacturing the semiconductor device illustrated in FIGS. 1A to 1C is described as an example of a method for manufacturing the semiconductor device in this embodiment with reference to FIGS. 2A1 to 2C2, FIGS. 3A1 to 3C2, FIGS. 4A1 to 4B2, FIGS. 5A1 to 5B2, and FIGS. 6A1 to 6B2. FIG. 2A1 to FIG. 6B2 are cross-sectional views illustrating an example of the method for manufacturing the semiconductor device illustrated in FIGS. 1A to 1C.

First, as illustrated in FIGS. 2A1 and 2A2, the semiconductor layer 101 is prepared, the insulating layer 102 is formed over one flat surface of the semiconductor layer 101, and then the semiconductor layer 103 is formed over one flat surface of the semiconductor layer 101 with the insulating layer 102 provided therebetween. Note that an oxide insulating layer or a nitride insulating layer may be formed over the semiconductor layer 101 in advance.

Here, an example of the formation method of the SOI substrate including the semiconductor layer 101, the insulating layer 102, and the semiconductor layer 103 is described below.

For example, a first semiconductor substrate is prepared as the semiconductor layer 101, and a second semiconductor substrate whose top surface is provided with the insulating layer 102 is prepared. Note that an impurity element imparting n-type or p-type conductivity may be added to the first semiconductor substrate in advance.

For example, the oxide insulating layer can be formed by formation of an oxide insulating film by thermal oxidation, CVD, sputtering, or the like. For example, the oxide insulating layer can be formed by formation of an oxide silicon film over the second semiconductor substrate with thermal oxidation treatment in thermal oxidation.

In addition, an ion beam including ions which are accelerated by an electric field enters the second semiconductor substrate and a fragile region is formed in a region at a certain depth from a surface of the second semiconductor substrate. Note that the depth at which the fragile region is formed is adjusted by the kinetic energy, mass, electrical charge, or incidence angle of the ions, or the like.

For example, ions can be introduced into the second semiconductor substrate with the use of an ion doping apparatus or an ion implantation apparatus.

As ions used for irradiation, for example, hydrogen and/or helium can be used. For example, in the case where irradiation is performed with hydrogen ions using an ion doping apparatus, the efficiency of irradiation of ions can be improved by increasing the proportion of $H_3^+$ in the ions used for irradiation. Specifically, it is preferable that the proportion of $H_3^+$ is higher than or equal to 50% (further preferably, higher than or equal to 80%) with respect to the total amount of $Ft$, $H_2^+$, and $H_3^+$.

Further, the first semiconductor substrate and the second semiconductor substrate are attached to each other with the insulating layer which is provided on the second semiconductor substrate provided therebetween. Note that in the case where the first semiconductor substrate is also provided with an insulating layer, the first semiconductor substrate and the second semiconductor substrate are attached to each other with the insulating layer on the second semiconductor substrate and the insulating layer on the first semiconductor substrate provided therebetween. In that case, the insulating layers provided between the first semiconductor substrate and the second semiconductor substrate correspond to the insulating layer 102.

Furthermore, heat treatment is performed so that the second semiconductor substrate is separated with the fragile region used as a cleavage plane. Thus, the semiconductor layer 103 can be formed over the insulating layer 102.

Note that when a surface of the semiconductor layer 103 is irradiated with laser light, the flatness of the surface of the semiconductor layer 103 can be improved.

However, this embodiment is not limited thereto, and for example, a Smart Cut (registered trademark) method or a SIMOX method can be used to form the SOI substrate.

Next, as illustrated in FIGS. 2B1 and 2B2, part of the semiconductor layer 103 is etched.

For example, a resist mask is formed over part of a layer or a film by a photolithography step, and the part of the layer or the film can be etched using the resist mask so that a layer can be formed. Note that in this case, the resist mask is removed after the layer is formed.

Alternatively, the resist mask may be formed using a light-exposure mask having a plurality of regions with different transmittances (also referred to as a multi-tone mask). With the multi-tone mask, a resist mask having regions with different thicknesses can be formed, so that the number of resist masks used for the manufacturing of the semiconductor device can be reduced.

Next, as illustrated in FIGS. 2C1 and 2C2, the insulating layer 104 is formed over one flat surface of the semiconductor layer 103.

For example, the insulating layer 104 can be formed by forming a film using a material that can be used for the insulating layer 104 by a sputtering method, a plasma CVD method, or the like. Alternatively, the insulating layer 104 can be a stack of films formed using materials that can be used for the insulating layer 104.

Note that after the semiconductor layer 103 is formed, an impurity element imparting n-type or p-type conductivity type may be added to the semiconductor layer 103. For example, after the insulating layer 104 is formed, the impurity element may be added to part of the semiconductor layer 103. The addition of the impurity element to the semiconductor layer 103 makes it possible to easily control a threshold voltage of a transistor including the semiconductor layer 103.

Next, as illustrated in FIGS. 3A1 and 3A2, a first conductive film is formed over the semiconductor layer 103 with the insulating layer 104 provided therebetween, and part of the first conductive film is etched, so that the conductive layer 105 is formed.

For example, the first conductive film can be formed by forming a film using a material that can be used for the conductive layer 105 by a sputtering method. The first conductive film can be formed by stacking layers each formed using a material that can be used for the first conductive film.

Next, as illustrated in FIGS. 3B1 and 3B2, an impurity element imparting one of p-type conductivity type and n-type conductivity type is added using the conductive layer 105 and a resist mask as masks, so that the region 103_b1 and the region 103_b2 are formed, whereas an impurity element imparting the other of the p-type conductivity type and the n-type conductivity type is added using another conductive layer formed using the first conductive film or a resist mask as a mask, so that the region 103_c is formed. At this time, in part of the semiconductor layer 103 which overlaps with the conductive layer 105 with the insulating layer 104 provided therebetween, a region between the region 103_b1 and the region 103_b2 is the region 103_a.

Next, as illustrated in FIGS. 3C1 and 3C2, a third insulating film is formed over the insulating layer 104 and the conductive layer 105 to form the insulating layer 106.

For example, the insulating layer 106 can be formed in such a manner that a silicon oxynitride film is formed over the insulating layer 104 and the conductive layer 105, a silicon nitride oxide film is formed over the silicon oxynitride film, and a silicon oxide film is formed over the silicon nitride oxide film.

Then, as illustrated in FIGS. 4A1 and 4A2, an oxide semiconductor film is formed over the insulating layer 106 and part of the oxide semiconductor film is etched to form the semiconductor layer 107.

Here, as an example of the semiconductor layer 107, for example, an oxide semiconductor layer that is CAAC is formed by a method described below.

In the example of the method for forming the semiconductor layer 107, one or both of a step of performing heat treatment once or plural times and a step of removing part of a semiconductor film may be included. At this time, the timing of the step of removing the part of the semiconductor film is not particularly limited thereto as long as it is performed after the formation of the semiconductor film before the formation of the conductive layer 110. Further, the timing of the step of performing heat treatment is not limited thereto as long as it is performed after the formation of the semiconductor film.

For example, the semiconductor film is formed by forming a film using a material that can be used for the semiconductor layer 107 by a sputtering method. At this time, the temperature of an element formation layer where the semiconductor film is formed is set higher than or equal to 100° C. and lower than or equal to 500° C., preferably higher than or equal to 200° C. and lower than or equal to 350° C. When the temperature of the element formation layer where the semiconductor film is formed is high, the semiconductor film can have atoms arranged in a triangular, hexagonal, equilateral triangular, or regular hexagonal shape when seen from a direction perpendicular to an a-b plane, and have a phase in which metal atoms are arranged in a layered manner when seen from the direction perpendicular to the c-axis direction or a phase in which metal atoms and oxygen atoms are arranged in a layered manner when seen from the direction perpendicular to the c-axis direction.

As the step of performing heat treatment, heat treatment (also referred to as heat treatment A) is performed at a temperature, for example, higher than or equal to 400° C. and lower than or equal to 750° C. or higher than or equal to 400° C. and lower than the strain point of the substrate. Note that the timing of the heat treatment A is not limited thereto as long as it is performed after the formation of the semiconductor film.

The heat treatment A can increase crystallinity in the semiconductor layer 107.

A heat treatment apparatus for the heat treatment A may be an electric furnace or an apparatus for heating an object by heat conduction or heat radiation from a heating element such as a resistance heating element. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating a process object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the high-temperature gas, a rare gas or an inert gas (e.g., nitrogen) which does not react with the object by the heat treatment can be used.

After the heat treatment A, a high-purity oxygen gas, a high-purity $N_2O$ gas, or ultra-dry air (with a dew point of lower than or equal to −40° C., preferably lower than or equal to −60° C.) may be introduced into the furnace that has been used in the above heat treatment A. It is preferable that the oxygen gas or the $N_2O$ gas do not contain water, hydrogen, and the like. The purity of the oxygen gas or the $N_2O$ gas which is introduced into the heat treatment apparatus is preferably equal to or more than 6N, more preferably equal to or more than 7N (i.e., the impurity concentration of the oxygen gas or the $N_2O$ gas is preferably equal to or lower than 1 ppm, more preferably equal to or lower than 0.1 ppm). By the action of the oxygen gas or the $N_2O$ gas, oxygen is supplied to the semiconductor film or the semiconductor layer 107, so that defects caused by oxygen deficiency in the semiconductor film or the semiconductor layer 107 can be reduced.

Next, as illustrated in FIGS. 4B1 and 4B2, for example, part of the insulating layer 104 and part of the insulating layer 106 are etched to form openings 111a to 111c which penetrate the insulating layer 104 and the insulating layer 106.

Next, as illustrated in FIGS. 5A1 and 5A2, a second conductive film is formed over the insulating layer 106 and the semiconductor layer 107, and part of the second conductive film is etched, so that the conductive layers 108a to 108e are formed.

For example, the second conductive film can be formed by forming a film using a material that can be used for the conductive layers 108a to 108e by a sputtering method. The second conductive film can be formed by stacking layers formed using materials that can be used for the second conductive film.

Next, as illustrated in FIGS. 5B1 and 5B2, a fourth insulating film is formed over the insulating layer 106, the semiconductor layer 107, and the conductive layers 108a to 108e to be in contact with the semiconductor layer 107, so that the insulating layer 109 is formed.

For example, the fourth insulating film can be formed by forming a film using a material which can be used for the insulating layer 109 by a sputtering method, a plasma CVD method, or the like. The fourth insulating film can also be formed by stacking films using materials that can be used for the fourth insulating film.

Moreover, when a film using a material which can be used for the insulating layer 109 is formed by a high-density plasma CVD method (e.g., a high-density plasma CVD method using microwaves such as a microwave at a frequency of 2.45 GHz), the insulating layer 109 can be dense and the withstand voltage of the insulating layer 109 can be improved.

Next, as illustrated in FIGS. 6A1 and 6A2, a third conductive film is formed over the insulating layer 109, and part of the third conductive film is etched to form the conductive layer 110.

For example, the third conductive film can be formed by forming a film using a material that can be used for the conductive layer 110 by a sputtering method. The third conductive film can be formed by stacking layers formed of materials that can be used for the third conductive film.

When a high-purity gas from which impurities such as hydrogen, water, a hydroxyl group, or a hydride are removed is used as a sputtering gas, the impurity concentration of a film to be formed can be reduced.

Note that before the film is formed by a sputtering method, heat treatment (also referred to as heat treatment B) may be performed in a preheating chamber of a sputtering apparatus. By the heat treatment B, impurities such as hydrogen or moisture can be eliminated.

Moreover, before the film is formed by a sputtering method, it is possible to perform the following treatment (called reverse sputtering): instead of applying a voltage to the target side, an RF power source is used for applying a voltage to the substrate side in an argon, nitrogen, helium, or oxygen atmosphere so that plasma is generated to modify a surface where the film is to be formed. With reverse sputtering, powdery substances (also referred to as particles or dust) attached to the surface where the film is to be formed can be removed.

In the case where the film is formed by a sputtering method, moisture remaining in a deposition chamber used for forming the film can be removed with an entrapment vacuum pump or the like. As the entrapment vacuum pump, a cryopump, an ion pump, or a titanium sublimation pump can be used, for example. Moreover, moisture remaining in the deposition chamber can be removed with a turbo pump provided with a cold trap.

Further, after the insulating layer 109 is formed, heat treatment (also referred to as heat treatment C) may be performed in an inert gas atmosphere or an oxygen gas atmosphere. At this time, the heat treatment C can be performed at a temperature higher than or equal to 200° C. and lower than or equal to 400° C., preferably higher than or equal to 250° C. and lower than or equal to 350° C.

Next, as illustrated in FIGS. 6B1 and 6B2, a dopant is added to the semiconductor layer 107 from a side on which the conductive layer 110 is formed through the insulating layer 109, whereby the region 107_b1 and the region 107_b2 are formed in a self-aligned manner. Accordingly, as compared to the case where a dopant is directly added to the semiconductor layer, over etching of the semiconductor layer 107 can be prevented, excessive damage to the semiconductor layer 107 can be reduced, and an interface between the semiconductor layer 107 and the insulating layer 109 can be kept clean. As a result, the characteristics and reliability of the transistor can be increased. At this time, a region between the region 107_b1 and the region 107_b2 is the region 107_a.

For example, the dopant can be added with the use of an ion doping apparatus or an ion implantation apparatus.

Note that after the dopant is added to the semiconductor layer 107, heat treatment may be performed.

This is the example of the method for manufacturing the transistor illustrated in FIGS. 1A to 1C.

In the example of the method for manufacturing the semiconductor device in this embodiment, when part of one conductive film is etched, a conductive layer functioning as the control terminal can be formed in the same step as conductive layers functioning as a source and a drain of a second field-effect transistor. As a result, an increase in the number of manufacturing steps can be suppressed.

Embodiment 2

In this embodiment, a semiconductor device having a different structure from that of Embodiment 1 will be described. Note that the description of the semiconductor device circuit in Embodiment 1 can be referred to as appropriate for the same portions as those in the semiconductor device described in Embodiment 1.

Figure 7A:
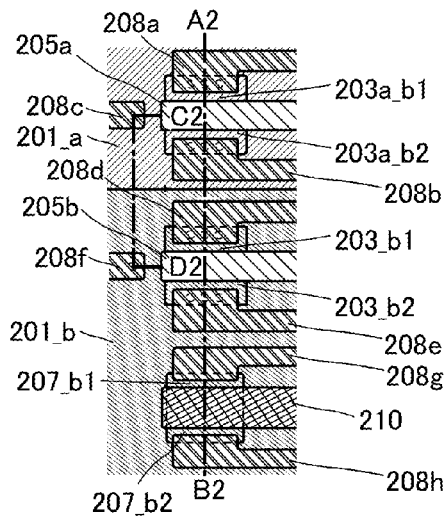
FIGS. 7A to 7C illustrate an example of the structure of a semiconductor device in Embodiment 2.

A structure example of the semiconductor device in this embodiment is described with reference to FIGS. 7A to 7C. FIG. 7A is a schematic top view, FIG. 7B is a schematic cross-sectional view taken along line A2-B2 of FIG. 7A, and FIG. 7C is a schematic cross-sectional view taken along line C2-D2 of FIG. 7A.

Figure 7B:
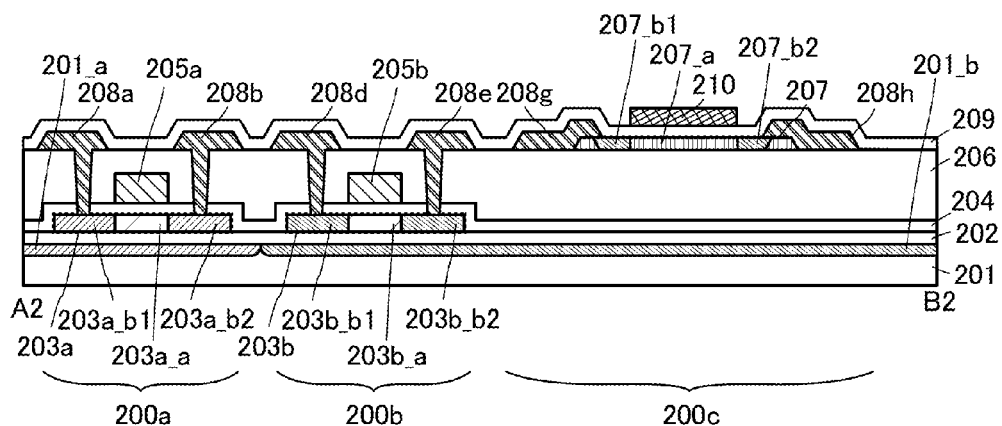
Figure 7C:
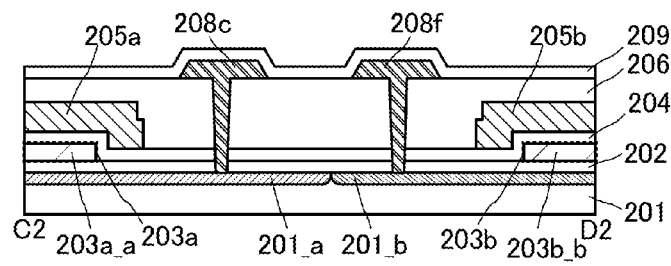

The semiconductor device illustrated in FIGS. 7A to 7C includes a semiconductor layer 201, an insulating layer 202, semiconductor layers 203a and 203b, an insulating layer 204, conductive layers 205a and 205b, an insulating layer 206, a semiconductor layer 207, conductive layers 208a to 208h, an insulating layer 209, and a conductive layer 210. A transistor 200a, a transistor 200b, and a transistor 200c are formed using the above structure.

The transistor 200a is formed using a signal crystal semiconductor layer of silicon or the like, for example. The transistor 200a is used as a transistor of a logic circuit in the semiconductor device, for example.

The transistor 200b is formed using a signal crystal semiconductor layer of silicon or the like, for example, and has a different conductivity type from the transistor 200a. The transistor 200b is used as a transistor of a logic circuit in the semiconductor device, for example.

However, this embodiment is not limited thereto, and the transistor 200a or the transistor 200b may be omitted.

The transistor 200c is a transistor including an oxide semiconductor layer whose off-state current is lower than that of a conventional transistor including a semiconductor layer of silicon or the like. As the transistor 200c, a transistor which can be used for the transistor 100b can be used. Data is input to a portion where a source or a drain of the transistor 200c is electrically connected to another circuit or element, and then the transistor 200c is turned off, whereby the data can be retained for a long time. However, this embodiment is not limited thereto, and the transistor 200c can also be used for a logic circuit or the like.

The semiconductor layer 201 corresponds to a first semiconductor region of an SOI substrate. The semiconductor layer 201 includes a region 201_a to which an impurity element imparting one of n-type conductivity type and p-type conductivity type is added and a region 201_b to which an impurity element imparting a conductivity type opposite to that of the region 201_a is added. For example, before the semiconductor layer 201 is attached to the semiconductor layer including the semiconductor layer 203a and the semiconductor layer 203b, an impurity element imparting n-type conductivity type or an impurity element imparting p-type conductivity type is selectively added to part of the semiconductor layer 201, whereby the region 201_a and the region 201_b can be formed.

For the semiconductor layer 201, a material which can be used for the semiconductor layer 101 in FIGS. 1A to 1C can be used, for example.

The insulating layer 202 is provided over the semiconductor layer 201

The insulating layer 202 corresponds to an insulating region in the SOI substrate. The insulating layer 202 can be formed using a layer of a material which can be used for the insulating layer 102 in FIGS. 1A to 1C, for example, and can be formed by a manufacturing method similar to that of the insulating layer 102.

The semiconductor layer 203a overlaps with the region 201_a with the insulating layer 202 provided therebetween, and the semiconductor layer 203b overlaps with the region 201_b with the insulating layer 202 provided therebetween.

The semiconductor layer 203a includes a region 203a_a, a region 203a_b1, and a region 203a_b2. Further, the semiconductor layer 203b includes a region 203b_a, a region 203b_b1, and a region 203b_b2.

The region 203a a is a region between the region 203a_b1 and the region 203a b2, and the region 203b_a is a region between the region 203b_b1 and the region 203b b2. The region 203a_a and the region 203b_a are channel formation regions.

The region 203a_b1 and the region 203a_b2 are apart from each other, and the region 203b_b1 and the region 203b b2 are apart from each other. The region 203a b1 is a region serving as one of a source region and a drain region of the transistor 200a, and the region 203a_b2 is a region serving as the other of the source region and the drain region of the transistor 200a. The region 203b_b1 is a region serving as one of a source region and a drain region of the transistor 200b, and the region 203b_b2 is a region serving as the other of the source region and the drain region of the transistor 200b. The region 203a b1 and the region 203a_b2 include an impurity element imparting n-type or p-type conductivity type. The region 203b_b1 and the region 203b b2 include an impurity element imparting a conductivity type opposite to that of the region 203a_b1 and the region 203a_b2.

The semiconductor layer 203a and the semiconductor layer 203b each correspond to at least part of a second semiconductor region in the SOI substrate. Note that the transistor 200a can be formed using a semiconductor region surrounded by an insulating region instead of the semiconductor layer 203a, and the transistor 200b can be formed using another semiconductor region surrounded by an insulating region instead of the semiconductor layer 203b.

The semiconductor layer 203a and the semiconductor layer 203b can be formed using a layer of a material which can be used for the semiconductor layer 103 in FIGS. 1A to 1C, for example, and can be formed using one semiconductor film by a manufacturing method similar to that of the semiconductor layer 103.

The insulating layer 204 is provided over one flat surface of the semiconductor layer 203a and one flat surface of the semiconductor layer 203b.

The insulating layer 204 can be formed using a layer of a material which can be used for the insulating layer 104 in FIGS. 1A to 1C, for example, and can be formed by a manufacturing method similar to that of the insulating layer 104.

The insulating layer 204 functions as a gate insulating layer in the transistor 200a and a gate insulating layer in the transistor 200b.

The conductive layer 205a overlaps with part of the semiconductor layer 203a (the region 203a_a) with the insulating layer 204 provided therebetween, and the conductive layer 205b overlaps with part of the semiconductor layer 203b (the region 203b_a) with the insulating layer 204 provided therebetween.

The conductive layer 205a and the conductive layer 205b can be formed using a layer of a material which can be used for the conductive layer 105 in FIGS. 1A to 1C, for example, and can be formed using one conductive film by a manufacturing method similar to that of the conductive layer 105.

The conductive layer 205a functions as a gate of the transistor 200a, and the conductive layer 205b functions as a gate of the transistor 200b.

The insulating layer 206 is provided over the insulating layer 204, the conductive layer 205a, and the conductive layer 205b.

The insulating layer 206 can be formed using a layer of a material which can be used for the insulating layer 106 in FIGS. 1A to 1C, for example, and can be formed by a manufacturing method similar to that of the insulating layer 106.

The insulating layer 206 functions as a planarization insulating layer.

The semiconductor layer 207 is provided over one flat surface of the insulating layer 206.

The semiconductor layer 207 includes a region 207_a. Further, a region 207_b1 and a region 207_b2 are provided in the semiconductor layer 207 as illustrated in FIGS. 7A and 7B but are not necessarily provided.

The region 207_a is a region between the region 207_b1 and the region 207_b2. The region 207_a is a channel formation region of the transistor 200c.

The region 207_b1 and the region 207_b2 are apart from each other and include elements serving as dopants The semiconductor layer 207 can be formed using a layer of a material which can be used for the semiconductor layer 107 in FIGS. 1A to 1C, for example, and can be formed by a manufacturing method similar to that of semiconductor layer 107.

The conductive layer 208a is electrically connected to the region 203a_b1 via a first opening which penetrates the insulating layer 204 and the insulating layer 206.

The conductive layer 208a functions as one of a source and a drain of the transistor 200a.

The conductive layer 208b is electrically connected to the region 203a_b2 via a second opening which penetrates the insulating layer 204 and the insulating layer 206.

The conductive layer 208b functions as the other of the source and the drain of the transistor 200a.

The conductive layer 208c is electrically connected to the region 201_a via a third opening which penetrates the insulating layer 202, the insulating layer 204, and the insulating layer 206.

The conductive layer 208c functions as a control terminal for controlling a voltage applied to the region 201_a.

The conductive layer 208d is electrically connected to the region 203b_b1 via a fourth opening which penetrates the insulating layer 204 and the insulating layer 206.

The conductive layer 208d functions as one of a source and a drain of the transistor 200b.

The conductive layer 208e is electrically connected to the region 203b_b2 via a fifth opening which penetrates the insulating layer 204 and the insulating layer 206.

The conductive layer 208e functions as the other of the source and the drain of the transistor 200b.

The conductive layer 208f is electrically connected to the region 201_b via a sixth opening which penetrates the insulating layer 202, the insulating layer 204, and the insulating layer 206.

The conductive layer 208f functions as a control terminal for controlling a voltage applied to the region 201_b.

The conductive layer 208g is electrically connected to the semiconductor layer 207.

The conductive layer 208g functions as one of a source and a drain of the transistor 200c.

The conductive layer 208h is electrically connected to the semiconductor layer 207.

The conductive layer 208h functions as the other of the source and the drain of the transistor 200c.

Note that although the conductive layer 208g and the conductive layer 208h are provided over the semiconductor layer 207 as illustrated in FIGS. 7A and 7B, this embodiment is not limited thereto, and the semiconductor layer 207 may be provided over the conductive layer 208g and the conductive layer 208h.

The conductive layer 208c and the conductive layer 208f are formed in the same step as the conductive layer 208g and the conductive layer 208h. In addition, the conductive layer 208a and conductive layer 208b, and the conductive layer 208d and the conductive layer 208e may be formed in the same step as the conductive layer 208c, the conductive layer 208f, the conductive layer 208g, and the conductive layer 208h. As the conductive layers 208a to 208h, a layer of a material which can be used for the conductive layers 108a to 108e in FIGS. 1A to 1C can be used. The conductive layers 208a to 208h can be used using one conductive film in the same manner as that of the conductive layers 108a to 108e.

The insulating layer 209 is provided over the insulating layer 206, the semiconductor layer 207, and the conductive layers 208a to 208h.

The insulating layer 209 can be formed using a layer of a material which can be used for the insulating layer 109 in FIGS. 1A to 1C, for example, and can be formed by a manufacturing method similar to that of the insulating layer 109.

The conductive layer 210 overlaps with the semiconductor layer 207 with the insulating layer 209 provided therebetween.

The conductive layer 210 can be formed using a layer of a material which can be used for the conductive layer 110 in FIGS. 1A to 1C, for example, and can be formed by a manufacturing method similar to that of the conductive layer 110.

In the semiconductor device illustrated in FIGS. 7A to 7C, when a first control voltage is applied via the conductive layer 208c, a voltage of the region 201_a can be controlled to be a level in accordance with the first control voltage, and the voltage applied to the semiconductor layer 203a can be controlled. In addition, when a second control voltage is applied via the conductive layer 208f, a voltage of the region 201_b can be controlled to be a level in accordance with the second control voltage, and the voltage applied to the semiconductor layer 203b can be controlled. For example, in the case where the transistor 200a is a p-channel transistor, when the level of the first control voltage is set high, a threshold of the transistor 200a is negatively shifted. In the case where the transistor 200b is an n-channel transistor, when the level of the second control voltage is set low, a threshold voltage of the transistor 200b is positively shifted. Thus, even in the case where the threshold voltages of the transistor 200a and the transistor 200b vary owing to the semiconductor layer 201, when the voltages of the region 203a_a and the region 203b_a are controlled and the threshold voltages of the transistor 200a and the transistor 200b are controlled, whereby the amount of current flowing between the source and the drain of each of the transistor 200a and the transistor 200b which are in an off state can be reduced. For example, the threshold voltages of the transistor 200a and the transistor 200b are preferably levels at which the transistor 200a and the transistor 200b become enhancement type transistors.

This is the example of the semiconductor device in this embodiment.

In the example of the semiconductor device in this embodiment, a field-effect transistor provided on an SOI substrate and a field-effect transistor including an oxide semiconductor layer are used. The use of the transistors enables an improvement in operation speed and a reduction in unnecessary current, thereby reducing power consumption.

Further, in the example of the semiconductor device in this embodiment, a control terminal for controlling a threshold voltage of the field-effect transistor provided on the SOI substrate is provided, and the threshold voltage of the field-effect transistor provided on the SOI substrate is controlled. As a result, it is possible to reduce the amount of current flowing between a source and a drain of the field-effect transistor which is provided on the SOI substrate and is in an off state, so that the power consumption of the semiconductor device can be reduced. Further, the threshold voltages of n-channel transistors or p-channel transistors which are provided on the SOI substrate and have the above structure can be each controlled.

Further, in the example of the semiconductor device in this embodiment, a conductive layer functioning as the control terminal can be formed in the same step as the source and the drain of the field-effect transistor including an oxide semiconductor layer. As a result, an increase in the number of manufacturing steps can be suppressed.

Embodiment 3

In this embodiment, a semiconductor device having a different structure from those of Embodiment 1 and Embodiment 2 will be described. Note that the descriptions of the semiconductor devices in Embodiment 1 and Embodiment 2 can be referred to as appropriate for the same portions as those in the semiconductor devices described in Embodiment 1 and Embodiment 2.

Figure 8A:
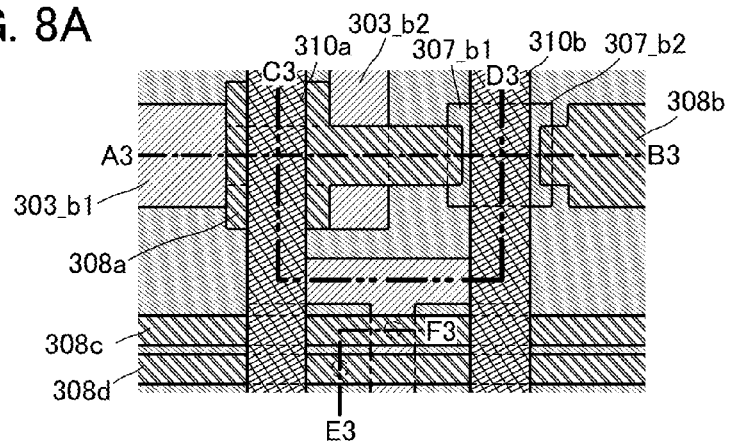
FIGS. 8A to 8D illustrate an example of the structure of a semiconductor device in Embodiment 3.
Figure 8B:
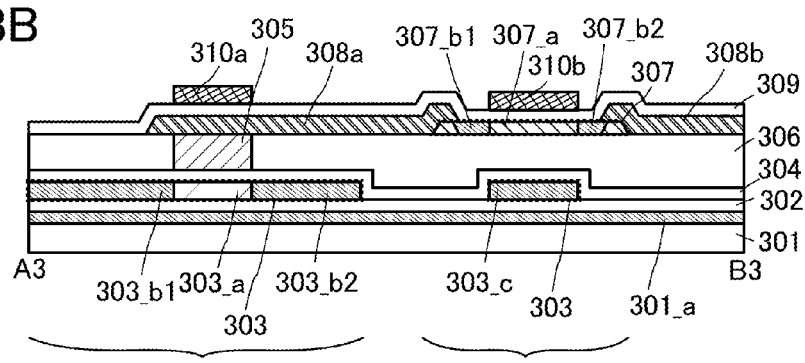
Figure 8C:
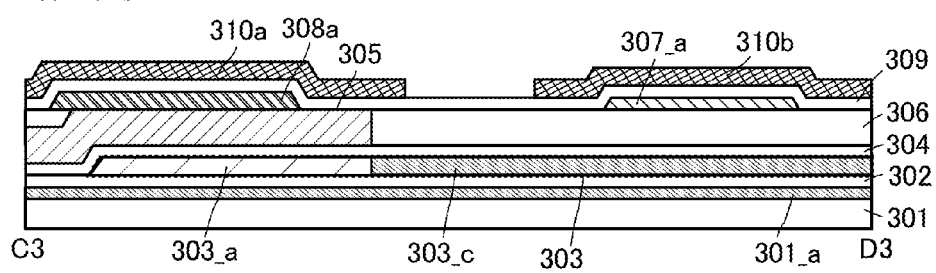
Figure 8D:
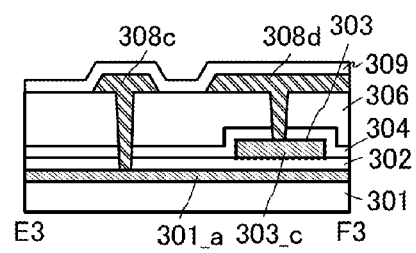

A structure example of the semiconductor device in this embodiment is described with reference to FIGS. 8A to 8D. FIG. 8A is a schematic top view, FIG. 8B is a schematic cross-sectional view taken along line A3-B3 of FIG. 8A, FIG. 8C is a schematic cross-sectional view taken along line C3-D3 of FIG. 8A, and FIG. 8D is a schematic cross-sectional view taken along line E3-F3 of FIG. 8A.

The semiconductor device illustrated in FIGS. 8A to 8D includes a semiconductor layer 301, an insulating layer 302, a semiconductor layer 303, an insulating layer 304, a conductive layer 305, an insulating layer 306, a semiconductor layer 307, conductive layers 308a to 308d, an insulating layer 309, a conductive layer 310a, and a conductive layer 310b. A transistor 300a and a transistor 300b are formed using the above structure.

The transistor 300a is formed using a signal crystal semiconductor layer of silicon or the like, for example. For example, the transistor 300a is used as a transistor in any of various logic circuits. The transistor 300a can be used as an output transistor in a memory circuit, for example.

However, this embodiment is not limited thereto, and as illustrated in FIGS. 7A to 7C, a transistor including a single crystal semiconductor layer may be provided in addition to the transistor 300a.

The transistor 300b is a transistor including an oxide semiconductor layer whose off-state current is lower than that of a conventional transistor including a semiconductor layer of silicon or the like. As the transistor 300b, a transistor which can be used for the transistor 100b can be used. At this time, the transistor 300b and the transistor 300a have the same conductivity type. The transistor 300b can be used as a transistor of a memory circuit, for example. Data is input to a portion where a source or a drain of the transistor 300b is electrically connected to another circuit or element, and then the transistor 300b is turned off, whereby the data can be retained for a long time. However, this embodiment is not limited thereto, and the transistor 300b can also be used for a logic circuit or the like.

The semiconductor layer 301 corresponds to a first semiconductor region in an SOI substrate. Note that in FIGS. 8A to 8D, the semiconductor layer 301 includes a region 301_a to which an impurity element imparting n-type or p-type conductivity type is added. For example, the impurity element is added to part of the semiconductor layer 301 before the semiconductor layer 301 and a semiconductor layer including the semiconductor layer 303 are attached to each other, whereby the region 301_a can be formed. Note that in the case where transistors including single crystal semiconductor layers having polarities different from each other, a plurality of impurity regions to which impurity elements having conductivity types different from each other are added may be provided. Note that it is possible to omit the region 301_a.

For the semiconductor layer 301, a material which can be used for the semiconductor layer 101 in FIGS. 1A to 1C can be used, for example.

The insulating layer 302 is provided over the semiconductor layer 301

The insulating layer 302 corresponds to an insulating region in the SOI substrate. The insulating layer 302 can be formed using a layer of a material which can be used for the insulating layer 102 in FIGS. 1A to 1C, for example, and can be formed by a manufacturing method similar to that of the insulating layer 102.

The semiconductor layer 303 overlaps with the region 301_a with the insulating layer 302 provided therebetween.

The semiconductor layer 303 includes a region 303_a, a region 303_b1, a region 303_b2, and a region 303_c.

The region 303_a is a region between the region 303_b1 and the region 303_b2. The region 303_a is a channel formation region.

The region 303_b1 and the region 303_b2 are apart from each other. The region 303_b1 is a region serving as one of a source region and a drain region of the transistor 300a, and the region 303_b2 is a region serving as the other of the source region and the drain region of the transistor 300a. The region 303_b1 and the region 303_b2 include an impurity element imparting n-type or p-type conductivity type.

Further, the region 303_c is in contact with the region 303_a where the channel is formed and includes an impurity element imparting a conductivity type opposite to that of the region 303_b1 and the region 303_b2. At this time, the region 303_c has a conductivity type opposite to that of the region 303_b1 and the region 303_b2. A voltage is applied to the region 303_a via the region 303_c. Further, the concentration of the impurity element added to the region 303_c is set higher than the concentration of the impurity element added to the region 303_a, whereby contact resistance with the region 303_a can be reduced.

The semiconductor layer 303 is at least part of a second semiconductor region in the SOI substrate. Note that the transistor 300a can also be formed in such a manner that a semiconductor region surrounded by an insulating region is used instead of the semiconductor layer 303.

The semiconductor layer 303 can be formed using a layer of a material which can be used for the semiconductor layer 103 in FIGS. 1A to 1C, for example, and can be formed using one semiconductor film by a manufacturing method similar to that of the semiconductor layer 103.

The insulating layer 304 is provided over one flat surface of the semiconductor layer 303.

The insulating layer 304 can be formed using a layer of a material which can be used for the insulating layer 104 in FIGS. 1A to 1C, for example, and can be formed by a manufacturing method similar to that of the insulating layer 104.

The insulating layer 304 functions as a gate insulating layer in the transistor 300a.

The conductive layer 305 overlaps with part of the semiconductor layer 303 (the region 303_a) with the insulating layer 304 provided therebetween.

The conductive layer 305 can be formed using a layer of a material which can be used for the conductive layer 105 in FIGS. 1A to 1C, for example, and can be formed using one conductive film by a manufacturing method similar to that of the conductive layer 105, for example.

The conductive layer 305 functions as a gate in the transistor 300a.

The insulating layer 306 is provided over the insulating layer 304 and the conductive layer 305.

The insulating layer 306 can be formed using a layer of a material which can be used for the insulating layer 106 in FIGS. 1A to 1C, for example, and can be formed by a manufacturing method similar to that of the insulating layer 106.

The insulating layer 306 functions as a planarization insulating layer.

The semiconductor layer 307 is provided over one flat surface of the insulating layer 306.

The semiconductor layer 307 includes a region 307a. Further, a region 307_b1 and a region 307_b2 are provided in the semiconductor layer 307 as illustrated in FIGS. 8A and 8B but are not necessarily provided.

The region 307_a is a region between the region 307_b1 and the region 307_b2. The region 307_a overlaps with the region 303_c with the insulating layer 304 and the insulating layer 306 provided therebetween. The region 307_a is a channel formation region of the transistor 300b.

The region 307_b1 and the region 307_b2 are apart from each other and include elements serving as dopants.

The semiconductor layer 307 can be formed using a layer of a material which can be used for the semiconductor layer 107 in FIGS. 1A to 1C, for example, and can be formed by a manufacturing method similar to that of the semiconductor layer 107.

The conductive layer 308a is in contact with the conductive layer 305 and electrically connected to the semiconductor layer 307. The structure in which the conductive layer 308a is in contact with the conductive layer 305 can be formed in such a manner that, for example, after the insulating layer 306 is formed, a surface of the conductive layer 305 is exposed by chemical polishing treatment or the like, and then the conductive layer 308a is formed.

Note that although the conductive layer 308a is in contact with the conductive layer 305 in FIGS. 8A to 8D, this embodiment is not limited thereto. The structure in which the conductive layer 308a is in contact with the conductive layer 305 makes it possible to increase a contact area as compared to that in the case where the conductive layer 308a is electrically connected to the conductive layer 305 via an opening of an insulating layer. As a result, contact resistance can be reduced.

The conductive layer 308a functions as one of the source and the drain of the transistor 300b.

The conductive layer 308b is electrically connected to the semiconductor layer 307.

The conductive layer 308b functions as the other of the source and the drain of the transistor 300b.

Note that although the conductive layer 308a and the conductive layer 308b are provided over the semiconductor layer 307 in FIGS. 8A to 8D, this embodiment is not limited thereto, and the semiconductor layer 307 may be provided over the conductive layer 308a and the conductive layer 308b.

The conductive layer 308c is electrically connected to the region 301_a via a first opening which penetrates the insulating layer 302, the insulating layer 304, and the insulating layer 306.

The conductive layer 308c functions as a control terminal for controlling a voltage applied to the region 301_a.

The conductive layer 308d is electrically connected to the region 303_c via a second opening which penetrates the insulating layer 304 and the insulating layer 306.

The conductive layer 308d functions as a second control terminal for controlling a voltage applied to the region 303_c.

The conductive layer 308c and the conductive layer 308d are formed in the same step as the conductive layer 308a and the conductive layer 308b. As the conductive layers 308a to 308d, a layer of a material which can be used for the conductive layers 108a to 108e in FIGS. 1A to 1C can be used. The conductive layers 308a to 308h can be used using one conductive film in the same manner as that of the conductive layers 108a to 108e.

When the region 301_a is not provided, it is possible to omit the conductive layer 308c.

The insulating layer 309 is provided over the insulating layer 306, the semiconductor layer 307, and the conductive layers 308a to 308d.

The insulating layer 309 can be formed using a layer of a material which can be used for the insulating layer 109 in FIGS. 1A to 1C, for example, and can be formed by a manufacturing method similar to that of the insulating layer 109.

The conductive layer 310a overlaps with the conductive layer 308a with the insulating layer 309 provided therebetween. The conductive layer 310a functions as a capacitor electrode of a capacitor.

Note that the capacitor can be formed with the conductive layer 308a, the insulating layer 309, and the conductive layer 310a. However, the capacitor is not necessarily provided.

The conductive layer 310b overlaps with the region 307_a with the insulating layer 309 provided therebetween. The conductive layer 310b functions as a gate of the transistor 300b.

The conductive layer 310a and the conductive layer 310b can be formed using a layer of a material which can be used for the conductive layer 110 in FIGS. 1A to 1C, for example, and can be formed by a manufacturing method similar to that of the conductive layer 110.

In the semiconductor device illustrated in FIGS. 8A to 8D, when a first control voltage is applied via the conductive layer 308c that is a first control terminal, a voltage of the region 301_a electrically connected to the conductive layer 308c can be controlled to be a level in accordance with the first control voltage. In addition, when a second control voltage is applied via the conductive layer 308d, a voltage of the region 303_a can be controlled to be a level in accordance with the second control voltage. At this time, the first control voltage and the second control voltage preferably have the same levels. In addition, when the second control voltage is applied via the conductive layer 308d, a voltage of the semiconductor layer 307 can also be controlled, and both of the voltage applied to the region 303_a and the voltage of the semiconductor layer 307 can be controlled. For example, in the case where the transistor 300a and the transistor 300b are n-channel transistors, when the levels of the first control voltage and the second control voltage are lowered, the threshold voltages of the transistor 300a and the transistor 300b are positively shifted. Accordingly, even in the case where the threshold voltages of the transistor 300a and the transistor 300b are varied, the voltages applied to the region 303_a and the region 307_a are controlled and the threshold voltages of the transistor 300a and the transistor 300b are controlled, whereby the amount of current flowing between a source and a drain of each of the transistor 300a and the transistor 300b which are in an off state can be reduced. The threshold voltages of the transistor 300a and the transistor 300b are preferably levels at which the transistor 300a and the transistor 300b become enhancement type transistors.

Further, another transistor having a different conductivity type from the transistor 300a may be provided on the SOI substrate in a similar manner to FIGS. 7A to 7C. At this time, the transistor having the different conductivity type from the transistor 300a can have the same structure as the transistor 300a except that a conductivity type of an impurity region is different from that of the transistor 300a. Accordingly, the transistor having the different conductivity type can be formed while an increase in the number of manufacturing steps is suppressed.

This is the example of the semiconductor device in this embodiment.

In the example of the semiconductor device in this embodiment, a field-effect transistor provided on an SOI substrate and a field-effect transistor including an oxide semiconductor layer are used. The use of the transistors enables an improvement in operation speed and a reduction in unnecessary current, thereby reducing power consumption.

Further, in the example of the semiconductor device in this embodiment, a control terminal for controlling a threshold voltage of the field-effect transistor provided on the SOI substrate is provided, and the threshold voltage of the field-effect transistor provided on the SOI substrate is controlled. As a result, it is possible to reduce the amount of current flowing between a source and a drain of the field-effect transistor which is provided on the SOI substrate and is in an off state, so that the power consumption of the semiconductor device can be reduced. Further, the threshold voltages of n-channel transistors or p-channel transistors which are provided on the SOI substrate and have the above structure can be each controlled.

In addition, in the example of the semiconductor device in this embodiment, the impurity region formed in the SOI substrate functions as the gate of the field-effect transistor including the oxide semiconductor layer. Consequently, since the threshold voltages of the first field-effect transistor and the second field-effect transistor can be controlled by a common control voltage, the number of wirings can be reduced and the area of a circuit of the semiconductor device can be reduced.

Further, in the example of the semiconductor device in this embodiment, a conductive layer functioning as the control terminal can be formed in the same step as the source and the drain of the second field-effect transistor including an oxide semiconductor layer. As a result, an increase in the number of manufacturing steps can be suppressed.

Embodiment 4

In this embodiment, an example of an arithmetic processing unit will be described as one example of a semiconductor device.

Figure 9:
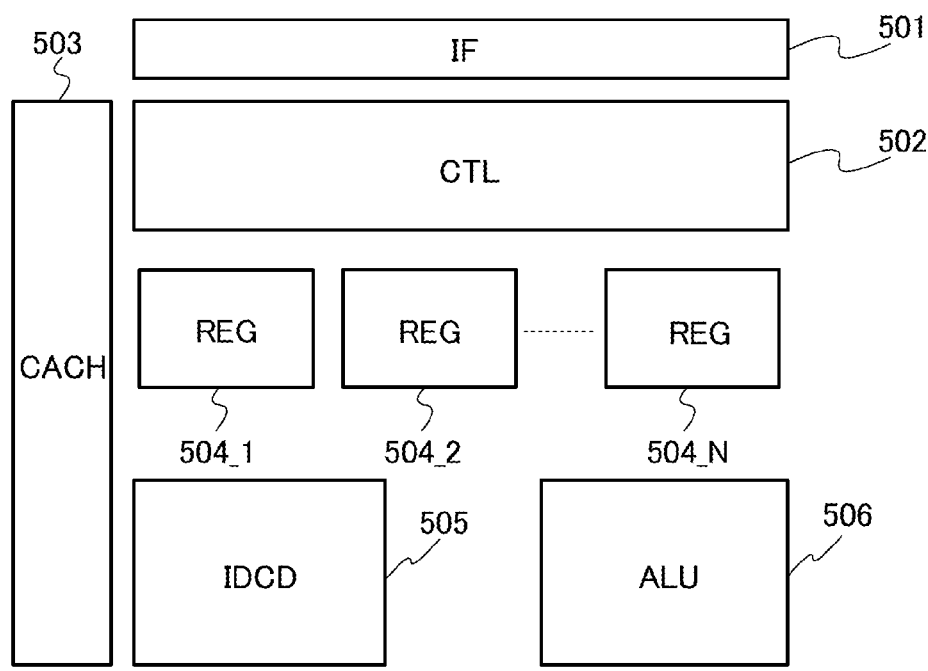
FIG. 9 illustrates an example of an arithmetic processing unit in Embodiment 4.

An example of the structure of the arithmetic processing unit in this embodiment is described with reference to FIG. 9. FIG. 9 illustrates the example of the structure of the arithmetic processing unit in this embodiment.

The arithmetic processing unit illustrated in FIG. 9 includes a bus interface (also referred to as an IF) 501, a control unit (also referred to as a CTL) 502, a cache memory (also referred to as a CACH) 503, N (N is a natural number greater than or equal to 3) registers (also referred to as REGs) 504 (registers 504_1 to 504_N), an instruction decoder (also referred to as an IDCD) 505, and an arithmetic logic unit (also referred to as an ALU) 506.

The bus interface 501 has a function of exchanging signals with the external of the arithmetic processing unit and a function of exchanging signals with circuits in the arithmetic processing unit, and the like.

The control unit 502 has a function of controlling operations of the circuits in the arithmetic processing unit.

The cache memory 503 is controlled by the control unit 502 and has a function of temporary retaining data during the operation of the arithmetic processing unit. Note that the arithmetic processing unit may include a plurality of cache memories 503.

The N registers 504 are controlled by the control unit 502 and each have a function of storing data used for arithmetic processing. For example, one register 504 may be used as a register for the arithmetic logic unit 506 and another register 504 may be used as a register for the instruction decoder 505.

For example, the N registers 504 can be formed by using a plurality of unit memory devices each of which is provided with the field-effect transistor provided on the SOI substrate and the field-effect transistor including the oxide semiconductor layer in the semiconductor device described in the above embodiment.

The instruction decoder 505 has a function of translating an instruction signal which is read. The translated instruction signal is input to the control unit 502, and the control unit 502 outputs a control signal in accordance with the instruction signal to the arithmetic logic unit 506.

The arithmetic logic unit 506 is controlled by the control unit 502 and has a function of performing arithmetic processing in accordance with the input instruction signal.

Two unit memory devices are described with reference to FIGS. 10A and 10B and FIGS. 11A to 11C as examples of the unit memory device.

First, the structure of one unit memory device is described with reference to FIG. 10A.

Figure 10A:
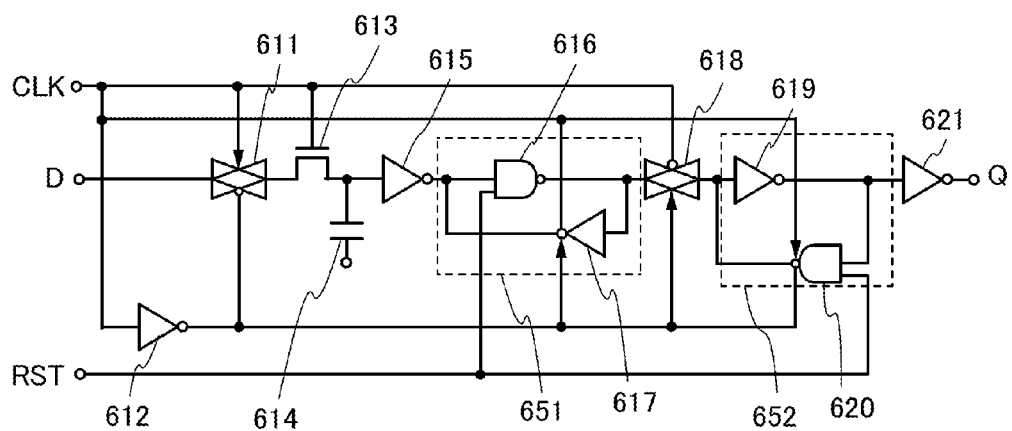
FIGS. 10A and 10B illustrate an example of the structure of a unit memory device.

The unit memory device illustrated in FIG. 10A includes an analog switch 611, a NOT gate (also referred to as an inverter) 612, a transistor 613, a capacitor 614, a NOT gate 615, a NAND gate 616, a clocked inverter 617, an analog switch 618, a NOT gate 619, a clocked NAND gate 620, and a NOT gate 621.

A data signal D is input to a data input terminal of the analog switch 611, a clock signal CLK is input to a first signal input terminal of the analog switch 611, and an inverted signal of the clock signal CLK is input to a second signal input terminal of the analog switch 611.

The clock signal CLK is input to a data input terminal of the NOT gate 612.

One of a source and a drain of the transistor 613 is electrically connected to a data output terminal of the analog switch 611, and the clock signal CLK is input to a gate of the transistor 613. The output signal from the analog switch 611 is input to the one of the source and the drain of the transistor 613. As the transistor 613, for example, the transistor including an oxide semiconductor layer described in the above embodiment can be used. For example, the transistor 100b in FIGS. 1A to 1C, the transistor 200c in FIGS. 7A to 7C, or the transistor 300b in FIGS. 8A to 8D can be used.

A first capacitor electrode of the capacitor 614 is electrically connected to the other of the source and the drain of the transistor 613. A low power supply voltage Vss is input to a second capacitor electrode of the capacitor 614.

A data input terminal of the NOT gate 615 is electrically connected to the other of the source and the drain of the transistor 613.

A first data input terminal of the NAND gate 616 is electrically connected to a data output terminal of the NOT gate 615. A reset signal RST is input to a second data input terminal of the NAND gate 616.

A data input terminal of the clocked inverter 617 is electrically connected to a data output terminal of the NAND gate 616. The inverted signal of the clock signal CLK is input to a first signal input terminal of the clocked inverter 617. The clock signal CLK is input to a second signal input terminal of the clocked inverter 617. A data output terminal of the clocked inverter 617 is electrically connected to the data output terminal of the NOT gate 615.

A data input terminal of the analog switch 618 is electrically connected to the data output terminal of the NAND gate 616. The inverted signal of the clock signal CLK is input to a first signal input terminal of the analog switch 618. The clock signal CLK is input to a second signal input terminal of the analog switch 618.

A data input terminal of the NOT gate 619 is electrically connected to a data output terminal of the analog switch 618.

A first data input terminal of the clocked NAND gate 620 is electrically connected to a data output terminal of the NOT gate 619. The reset signal RST is input to a second data input terminal of the clocked NAND gate 620. The clock signal CLK is input to a first signal input terminal of the clocked NAND gate 620. The inverted signal of the clocked signal CLK is input to a second input terminal of the clocked NAND gate 620. A data output terminal of the clocked NAND gate 620 is electrically connected to the data output terminal of the analog switch 618. The clocked NAND gate 620 is formed with a NAND gate and an analog switch, for example.

A data input terminal of the NOT gate 621 is electrically connected to the data output terminal of the NOT gate 619 and the first data input terminal of the clocked NAND gate 620. A data signal Q is output from a data output terminal of the NOT gate 621.

Further, one or more of the analog switch 611, the NOT gate 612, the NOT gate 615, a latch circuit 651, the analog switch 618, a latch circuit 652, and the NOT gate 621 include the field-effect transistor provided on an SOI substrate described in the above embodiment, and for example, the transistor 100a in FIGS. 1A to 1C, the transistor 200b in FIGS. 7A to 7C, or the transistor 300a in FIGS. 8A to 8D can be used.

Figure 10B:
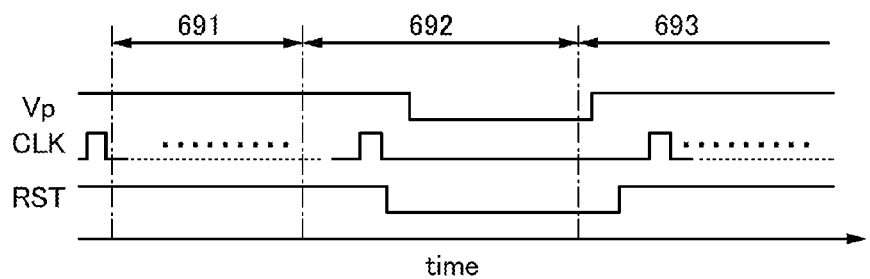

Next, an operation example of the unit memory device illustrated in FIG. 10A is described with reference to FIG. 10B. FIG. 10B is a timing chart showing the operation example of the sequential circuit in FIG. 10A.

In a period 691, a power supply voltage Vp, the clock signal CLK, and the reset signal RST are supplied to the unit memory device illustrated in FIG. 10A. At this time, the reset signal is set at a high level.

When the clock signal CLK is set at a high level, the analog switch 611 and the transistor 613 are turned on and the analog switch 618 is turned off. At this time, a voltage of the first capacitor electrode of the capacitor 614 becomes equal to a voltage of the data signal D. As a result, data of the data signal D is written in the unit memory device.

When the clock signal CLK is set at a low level, the analog switch 611 and the transistor 613 are turned off and the analog switch 618 is turned on. At this time, a voltage of a signal Q becomes a voltage of the data of the data signal D, and the written data of the data signal D is output from the unit memory device.

To stop the operation of the unit memory device, as shown in a period 692, the supply of the clock signal CLK and the supply of the reset signal RST are stopped, and then the supply of the power supply voltage Vp is stopped. At this time, the timing of stopping the supply of the clock signal CLK may be different from the timing of stopping the supply of the reset signal RST.

At this time, although operations of the analog switch 611, the NOT gate 612, the transistor 613, the latch circuit 651, the analog switch 618, the latch circuit 652, and the NOT gate 621 are stopped, the voltage of the first capacitor electrode of the capacitor 614 is kept for a certain period, at the voltage of the data signal D in the period before the operation of the unit memory device is stopped because an off-state current of the transistor 613 is low.

In addition, in the case where the operation of the unit memory device restarts, as shown in a period 693, the supply of the power supply voltage Vp restarts first; the supply of the reset signal RST restarts; and then, the supply of the clock signal CLK restarts.

At this time, the operations of the analog switch 611, the NOT gate 612, the transistor 613, the latch circuit 651, the analog switch 618, the latch circuit 652, and the NOT gate 621 restart. When the clock signal CLK is at a low level, the voltage of the signal Q becomes the voltage of the data of the data signal D written in the unit memory device, and the written data of the data signal D is output from the unit memory device. As a result, the state of the unit memory device can be returned to the state at the time before the operation of the unit memory device is stopped.

This is the operation example of the unit memory device illustrated in FIG. 10A.

Another example of the unit memory device is described with reference to FIGS. 11A to 11C.

Figure 11A:
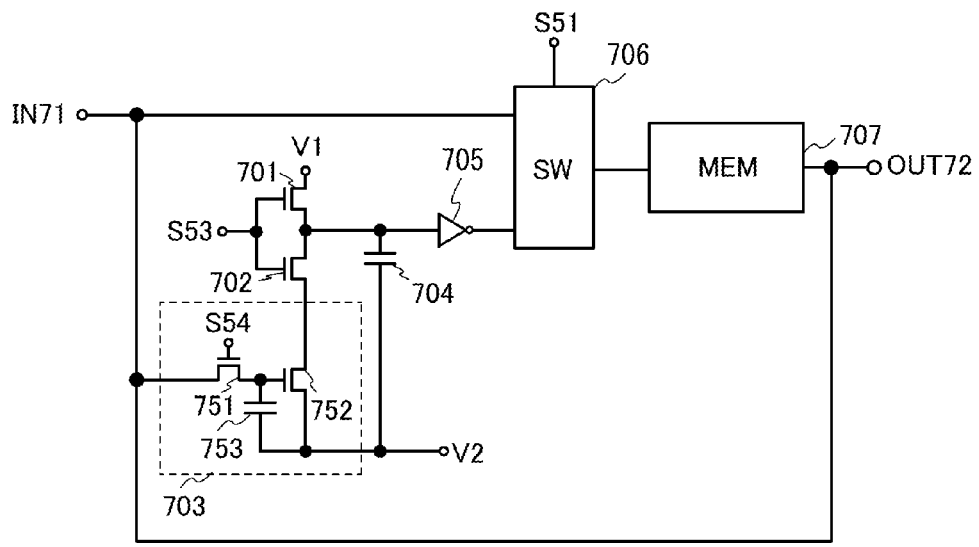
FIGS. 11A to 11C illustrate an example of the structure of a unit memory device.

A unit memory device illustrated in FIG. 11A inputs a data signal IN71. The unit memory device illustrated in FIG. 11A outputs a data signal OUT72. The unit memory device illustrated in FIG. 11A includes a transistor 701, a transistor 702, a memory circuit 703, a capacitor 704, a NOT gate 705, a switching circuit (also referred to as a SW) 706, and a memory circuit (also referred to as a MEM) 707.

A voltage V1 is input to one of a source and a drain of the transistor 701, and a signal S53 is input to a gate of the transistor 701.

The transistor 702 has a different conductivity type from the transistor 701. One of a source and a drain of the transistor 702 is electrically connected to the other of the source and the drain of the transistor 701, and the signal S53 is input to a gate of the transistor 702.

The memory circuit 703 includes a transistor 751, a transistor 752, and a capacitor 753.

The data signal IN71 is input to one of a source and a drain of the transistor 751, and a signal S54 is input to a gate of the transistor 751.

As the transistor 751, for example, the transistor including an oxide semiconductor layer described in the above embodiment can be used. For example, the transistor 100b in FIGS. 1A to 1C, the transistor 200c in FIGS. 7A to 7C, or the transistor 300b in FIGS. 8A to 8D can be used A gate of the transistor 752 is electrically connected to the other of the source and the drain of the transistor 751, one of a source and a drain of the transistor 752 is electrically connected to the other of the source and the drain of the transistor 702, and a voltage V2 is input to the other of the source and the drain of the transistor 752.

As the transistor 752, for example, the field-effect transistor provided on the SOI substrate described in the above embodiment can be used. For example, the transistor 100a in FIGS. 1A to 1C, the transistor 200a or 200b in FIGS. 7A to 7C, or the transistor 300a in FIGS. 8A to 8D can be used.

A first capacitor electrode of the capacitor 753 is electrically connected to the other of the source and the drain of the t transistor 751, and the voltage V2 is input to a second capacitor electrode of the capacitor 753. As the capacitor 753, the capacitor illustrated in FIGS. 8A to 8D can be used. Note that the capacitor 753 is not necessarily provided.

Figure 11B:
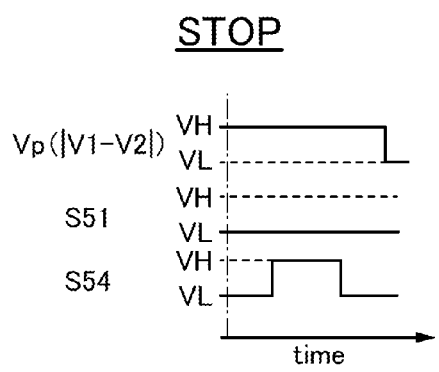

Note that a difference between the voltage V1 and the voltage V2 is the power supply voltage Vp in FIGS. 11A and 11B.

A first capacitor electrode of the capacitor 704 is electrically connected to the other of the source and the drain of the transistor 701, and the voltage V2 is input to a second capacitor electrode of the capacitor 704.

A data input terminal of the NOT gate 705 is electrically connected to the other of the source and the drain of the transistor 701.

A signal S51, the data signal IN71, an output signal from the NOT gate 705 (also referred to as a data signal D71) are input to the switching circuit 706. The switching circuit 706 has a function of outputting, in accordance with the signal S51, a data signal D72 which has a value corresponding to the data signal IN71 or the data signal D71.

The switching circuit 706 includes, for example, at least two analog switches. For example, when one of the two analog switches is turned on, the other of the two analog switches is turned off, whereby data of the data signal D72 can be switched to the value corresponding to the data signal IN71 or the data signal D71.

A data signal D72 is input from the switching circuit 706 to the memory circuit 707. The memory circuit 707 outputs a signal S52 whose value is set in accordance with the signal input to the memory circuit 707. The signal S52 becomes the data signal OUT72.

The memory circuit 707 includes a flip-flop formed using a transistor including a single crystal semiconductor layer, for example.

The transistor 701, the transistor 702, the NOT gate 705, the switching circuit 706, and the memory circuit 707 are formed using, for example, the field-effect transistor provided on the SOI substrate described in the above embodiment. For example, the transistor 100a in FIGS. 1A to 1C, the transistor 200a or 200b in FIGS. 7A to 7C, or the transistor 300a in FIGS. 8A to 8D can be used Next, an operation example of the unit memory device illustrated in FIG. 11A is described with reference to FIGS. 11B and 11C. FIGS. 11B and 11C are each a timing chart for describing the operation example of the sequential circuit in FIG. 11A.

In the unit memory device illustrated in FIG. 11A, during a period in which the power supply voltage Vp is supplied, the signal S51 is set at a low level, the data signal D72 becomes the value corresponding to the data signal IN71 by the switching circuit 706, and the data of the data signal D72 which has the value corresponding to the data signal IN71 is stored in the memory circuit 707.

whereto stop the operation of the unit memory device, as shown in FIG. 11B, the signal S51 is set at a low level, and then a pulse of the signal S54 is input to the gate of the transistor 751.

At this time, the transistor 751 is turned on, and a voltage of the first capacitor electrode of the capacitor 753 becomes equal to a voltage of the data stored in the memory circuit 707. Then, after the input of the pulse of the signal S54 is completed, the transistor 751 is turned off. At this time, the voltage of the first capacitor electrode of the capacitor 753 is kept for a certain period because an off-state current of the transistor 751 is low. After that, the supply of the power supply voltage Vp to the unit memory device is stopped.

Figure 11C:
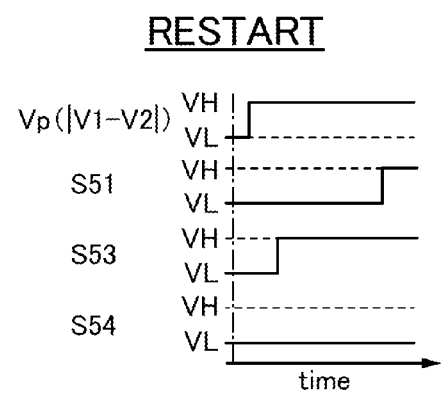

To restart the operation of the unit memory device, as shown in FIG. 11C, the supply of the power supply voltage Vp restarts, and then the signal S53 is set at a low level. At this time, the signal S51 and the signal S54 are each set at a low level.

At this time, the transistor 701 is turned on and the transistor 702 is turned off, so that the voltage of the first capacitor electrode of the capacitor 704 becomes equal to the voltage V1.

After that, the signal S53 is set at a high level. At this time, the transistor 701 is turned off and the transistor 702 is turned on, so that the voltage of the first capacitor electrode of the capacitor 704 is changed depending on a current flowing between the source and the drain of the transistor 752. The current flowing between the source and the drain of the transistor 752 is determined by a voltage of the gate of the transistor 752, that is, determined depending on the data input from the memory circuit 703 which is stored in the first capacitor electrode of the capacitor. Therefore, when the transistor 702 is turned on, the voltage of the first capacitor electrode of the capacitor 704 can be the value corresponding to the data signal IN71.

After that the signal S51 is set at a high level while keeping the signal S53 at the high level.

At this time, the data signal D72 has the value corresponding to the signal D71 (the value corresponding to the data written in the memory circuit 703) by the switching circuit 706, and the signal D72 having the value corresponding to the data signal D71 is input to the memory circuit 707. As a result, the state of the memory circuit 707 can be returned to the state at the time before the operation of the unit memory device is stopped This is the operation example of the unit memory device illustrated in FIG. 11A.

In the arithmetic processing unit of this embodiment in which the register includes the unit memory device, even when the supply of the power supply voltage is stopped, part of internal data in the state at the time just before the supply of the power supply voltage is stopped can be retained, and when the supply of the power supply voltage restarts, the state of the arithmetic processing unit can be returned to the state at the time just before the supply of the power supply voltage is stopped. Accordingly, even when power consumption is reduced by selectively stopping the supply of the power supply voltage, a time after the supply of the power supply voltage restarts until the normal operation starts can be shortened.

Embodiment 5

In this embodiment, CAAC will be described.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

An example of such a CAAC is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 13A to 13E, FIGS. 14A to 14C, and FIGS. 15A to 15C. In FIGS. 13A to 13E, FIGS. 14A to 14C, and FIGS. 15A to 15C, the vertical direction corresponds to the c-axis direction and a plane perpendicular to the c-axis direction corresponds to the a-b plane, unless otherwise specified. In the case where the expressions "an upper half" and "a lower half" are simply used, they refer to an upper half above the a-b plane and a lower half below the a-b plane (an upper half and a lower half with respect to the a-b plane).

Figure 13A:
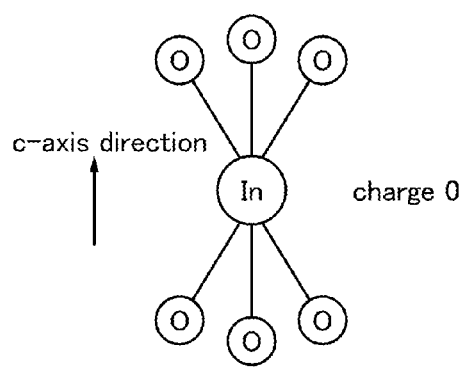
FIGS. 13A to 13E illustrate structures of oxide materials.

FIG. 13A illustrates a structure including one hexacoordinate In atom and six tetracoordinate oxygen (hereinafter referred to as tetracoordinate O) atoms proximate to the In atom. Here, a structure including one metal atom and oxygen atoms proximate to the metal atom is referred to as a small group. The structure in FIG. 13A is actually an octahedral structure, but is illustrated as a planar structure for simplicity. Note that three tetracoordinate O atoms exist in each of an upper half and a lower half in FIG. 13A. In the small group illustrated in FIG. 13A, electric charge is 0.

Figure 13D:
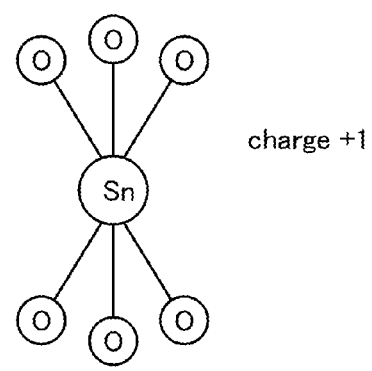
Figure 13B:
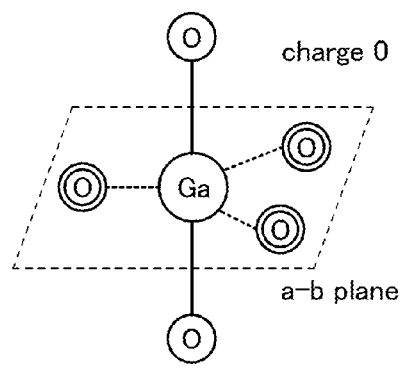

FIG. 13B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 13B. An In atom can also have the structure illustrated in FIG. 13B because an In atom can have five ligands. In the small group illustrated in FIG. 13B, electric charge is 0.

Figure 13E:
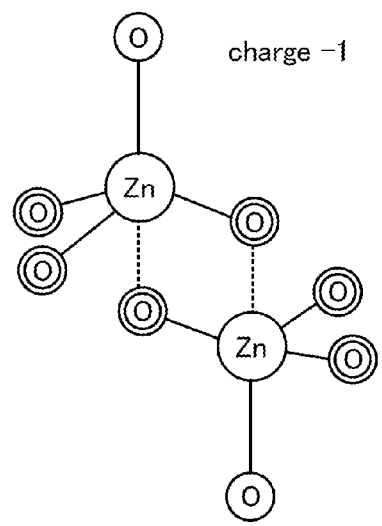
Figure 13C:
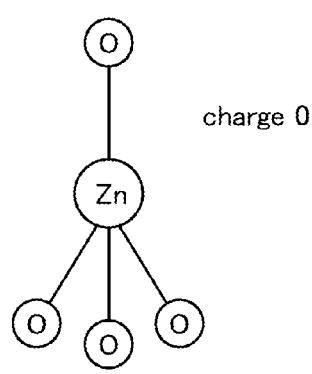

FIG. 13C illustrates a structure including one tetracoordinate Zn atom and four tetracoordinate O atoms proximate to the Zn atom. In FIG. 13C, one tetracoordinate O atom exists in an upper half and three tetracoordinate O atoms exist in a lower half Alternatively, three tetracoordinate O atoms may exist in the upper half and one tetracoordinate O atom may exist in the lower half in FIG. 13C. In the small group illustrated in FIG. 13C, electric charge is 0.

FIG. 13D illustrates a structure including one hexacoordinate Sn atom and six tetracoordinate O atoms proximate to the Sn atom. In FIG. 13D, three tetracoordinate O atoms exist in each of an upper half and a lower half. In the small group illustrated in FIG. 13D, electric charge is +1.

FIG. 13E illustrates a small group including two Zn atoms. In FIG. 13E, one tetracoordinate O atom exists in each of an upper half and a lower half. In the small group illustrated in FIG. 13E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 13A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction.

In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom having the above coordination number is bonded to another metal atom having the above coordination number through a tetracoordinate O atom in the c-axis direction. In addition to the above, a medium group can be formed in a different manner by combining a plurality of small groups so that the total electric charge of the layered structure is 0.

Figure 14A:
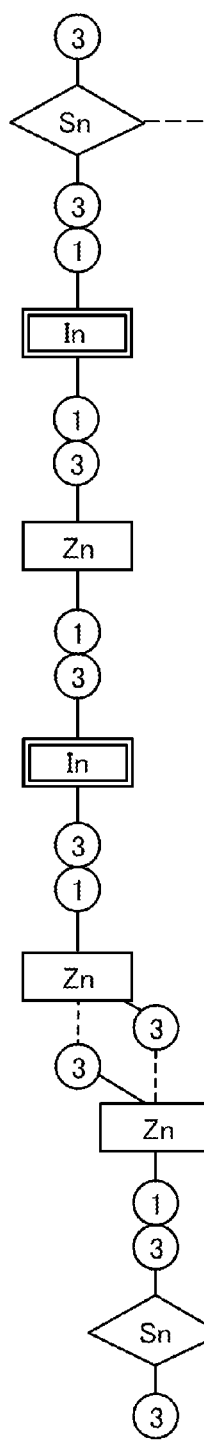
FIGS. 14A to 14C illustrate the structure of an oxide material.
Figure 14B:
Figure 14C:

FIG. 14A illustrates a model of a medium group included in a layered structure of an In—Sn—Zn—O-based material. FIG. 14B illustrates a large group including three medium groups. FIG. 14C illustrates an arrangement order in the case where the layered structure in FIG. 14B is observed from the c-axis direction.

In FIG. 14A, for simplicity, a tricoordinate O atom is omitted and tetracoordinate O atoms are shown by a circle; the number in the circle shows the number of tetracoordinate O atoms. For example, three tetracoordinate O atoms existing in each of an upper half and a lower half with respect to a Sn atom are denoted by circled 3. Similarly, in FIG. 14A, one tetracoordinate O atom existing in each of an upper half and a lower half with respect to an In atom is denoted by circled 1. FIG. 14A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 14A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 13E can be given. For example, with one small group including two Zn atoms, electric charge of one small group including a Sn atom can be cancelled, so that the total electric charge of the layered structure can be 0.

When the large group illustrated in FIG. 14B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number). As larger m is, the crystallinity of the In—Sn—Zn—O-based crystal is improved, which is preferable.

The above-described rule also applies to the followings: a four-component metal oxide such as an In—Sn—Ga—Zn—O-based metal oxide; a three-component metal oxide such as an In—Ga—Zn—O-based metal oxide (also referred to as IGZO), an In—Al—Zn—O-based metal oxide, a Sn—Ga—Zn—O-based metal oxide, an Al—Ga—Zn—O-based metal oxide, a Sn—Al—Zn—O-based metal oxide, an In—Hf—Zn—O-based metal oxide, an In—La—Zn—O-based metal oxide, an In—Ce—Zn—O-based metal oxide, an In—Pr—Zn—O-based metal oxide, an In—Nd—Zn—O-based metal oxide, an In—Sm—Zn—O-based metal oxide, an In—Eu—Zn—O-based metal oxide, an In—Gd—Zn—O-based metal oxide, an In—Tb—Zn—O-based metal oxide, an In—Dy—Zn—O-based metal oxide, an In—Ho—Zn—O-based metal oxide, an In—Er—Zn—O-based metal oxide, an In—Tm—Zn—O-based metal oxide, an In—Yb—Zn—O-based metal oxide, or an In—Lu—Zn—O-based metal oxide; a two-component metal oxide such as an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, or an In—Ga—O-based metal oxide; a single-component metal oxide such as an In—O-based metal oxide, a Sn—O-based metal oxide, or a Zn—O-based metal oxide; and the like.

As an example, FIG. 15A illustrates a model of a medium group included in a layered structure of an In—Ga—Zn—O-based material.

In the medium group included in the layered structure of the In—Ga—Zn—O-based material in FIG. 15A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

FIG. 15B illustrates a large group including three medium groups. FIG. 15C illustrates an atomic arrangement in the case where the layered structure in FIG. 15B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 15A but also a medium group in which the arrangement of the In atom, the Ga atom, and the Zn atom is different from that in FIG. 15A.

Embodiment 6

In this embodiment, the field-effect mobility of a transistor will be described.

The actually measured field-effect mobility of an insulated gate transistor can be lower than its original mobility because of a variety of reasons; this phenomenon occurs not only in the case of using an oxide semiconductor. One of the factors that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed as the following formula.

$$\mu = \mu_0 \exp\left(-\frac{E}{kT}\right) \quad \text{[Formula 2]}$$

Here, E represents the height of the potential barrier, k represents the Boltzmann constant, and T represents the absolute temperature. When the potential barrier is assumed to be attributed to a defect, the height of the potential barrier can be expressed as the following formula according to the Levinson model.

$$E = \frac{e^2 N^2}{8\varepsilon n} = \frac{e^3 N^2 t}{8\varepsilon C_{ox} V_g} \quad \text{[Formula 3]}$$

Here, e represents the elementary charge, N represents the average defect density per unit area in a channel, $\varepsilon$ represents the dielectric constant of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is 30 nm or less, the thickness of the channel may be regarded as being the same as the thickness of the semiconductor layer. The drain current $I_d$ in a linear region can be expressed as the following formula.

$$I_d = \frac{W \mu V_g V_d C_{ox}}{L} \exp\left(-\frac{E}{kT}\right) \quad \text{[Formula 4]}$$

Here, L represents the channel length and W represents the channel width, and L and W are each 10 μm. In addition, $V_d$ represents the drain voltage. When dividing both sides of the above equation by $V_g$ and then taking logarithms of both sides, the following formula can be obtained.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT\varepsilon C_{ox} V_g} \quad \text{[Formula 5]}$$

The right side of Formula 5 is a function of $V_g$. From the formula, it is found that the defect density N can be obtained from the slope of a line in which $\ln(I_d/V_g)$ is the ordinate and $1/V_g$ is the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/\text{cm}^2$.

On the basis of the defect density obtained in this manner, or the like, $\mu_0$ can be calculated to be 120 cm²/Vs from Formula 2 and Formula 3. The measured mobility of an In—Sn—Zn oxide including a defect is approximately 35 cm²/Vs. However, assuming that no defect exists inside the semiconductor and at the interface between the semiconductor and an insulating film, the mobility $\mu_0$ of the oxide semiconductor is expected to be 120 cm²/Vs.

Note that even when no defect exists inside a semiconductor, scattering at an interface between a channel and a gate insulating layer affects the transport property of the transistor. In other words, the mobility $\mu_1$ at a position that is distance x away from the interface between the channel and the gate insulating layer can be expressed as the following formula.

$$\frac{1}{\mu_1} = \frac{1}{\mu_0} + \frac{D}{B} \exp\left(-\frac{x}{G}\right) \quad \text{[Formula 6]}$$

Here, D represents the electric field in the gate direction, and B and G are constants. B and G can be obtained from actual measurement results; according to the above measurement results, B is $4.75 \times 10^7$ cm/s and G is 10 nm (the depth to which the influence of interface scattering reaches). When D is increased (i.e., when the gate voltage is increased), the second term of Formula 6 is increased and accordingly the mobility $\mu_1$ is decreased.

Figure 16:
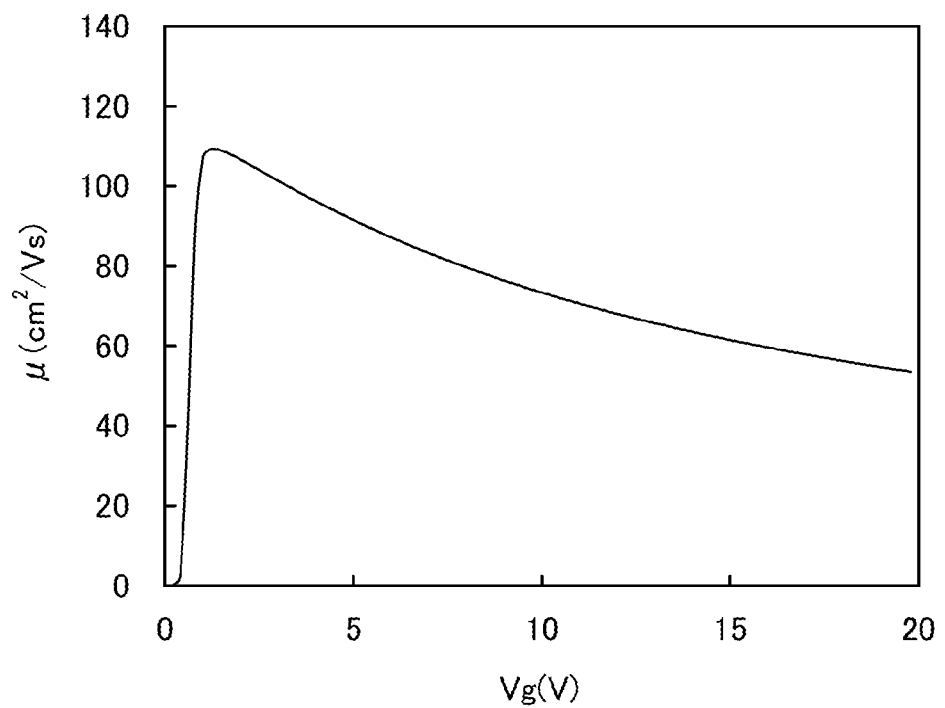
FIG. 16 is a graph showing gate voltage dependence of mobility obtained by calculation.

Calculation results of the mobility $\mu_2$ of a transistor whose channel includes an ideal oxide semiconductor without a defect inside the semiconductor are shown in FIG. 16. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by sputtering.

Further, the work functions of a gate, a source, and a drain were assumed to be 5.5 eV, 4.6 eV, and 4.6 eV, respectively. The thickness of a gate insulating layer was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 16, the mobility has a peak of 100 cm²/Vs or more at a gate voltage that is a little over 1 V and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors which are manufactured using an oxide semiconductor having such a mobility are shown in FIGS. 17A to 17C, FIGS. 18A to 18C, and FIGS. 19A to 19C. FIGS. 20A and 20B illustrate cross-sectional structures of the transistors used for the calculation. The transistors illustrated in FIGS. 20A and 20B each include a semiconductor region 2103a and a semiconductor region 2103c which have n+-type conductivity in an oxide semiconductor layer. The resistivities of the semiconductor region 2103a and the semiconductor region 2103c are $2 \times 10^{-3}$ Ωcm.

The transistor illustrated in FIG. 20A is formed over a base insulating layer 2101 and an embedded insulator 2102 which is embedded in the base insulating layer 2101 and formed of aluminum oxide. The transistor includes the semiconductor region 2103a, the semiconductor region 2103c, an intrinsic semiconductor region 2103b serving as a channel formation region therebetween, and a gate 2105. The width of the gate 2105 is 33 nm.

A gate insulating layer 2104 is formed between the gate 2105 and the semiconductor region 2103b. In addition, a sidewall insulator 2106a and a sidewall insulator 2106b are formed on both side surfaces of the gate 2105, and an insulator 2107 is formed over the gate 2105 so as to prevent a short circuit between the gate 2105 and another wiring. The sidewall insulator has a width of 5 nm. A source 2108a and a drain 2108b are provided in contact with the semiconductor region 2103a and the semiconductor region 2103c, respectively. Note that the channel width of this transistor is 40 nm.

The transistor of FIG. 20B is the same as the transistor of FIG. 20A in that it is formed over the base insulating layer 2101 and the embedded insulator 2102 formed of aluminum oxide and that it includes the semiconductor region 2103a, the semiconductor region 2103c, the intrinsic semiconductor region 2103b provided therebetween, the gate 2105 having a width of 33 nm, the gate insulating layer 2104, the sidewall insulator 2106a, the sidewall insulator 2106b, the insulator 2107, the source 2108a, and the drain 2108b.

The transistor illustrated in FIG. 20B is different from the transistor illustrated in FIG. 20A in the conductivity type of semiconductor regions under the sidewall insulator 2106a and the sidewall insulator 2106b. In the transistor illustrated in FIG. 20A, the semiconductor regions under the sidewall insulator 2106a and the sidewall insulator 2106b are part of the semiconductor region 2103a having n'-type conductivity and part of the semiconductor region 2103c having n'-type conductivity, whereas in the transistor illustrated in FIG. 20B, the semiconductor regions under the sidewall insulator 2106a and the sidewall insulator 2106b are part of the intrinsic semiconductor region 2103b. In other words, a region having a width of $L_{off}$ which overlaps with neither the semiconductor region 2103a (the semiconductor region 2103c) nor the gate 2105 is provided. This region is called an offset region, and the width $L_{off}$ is called an offset length. As is seen from the drawing, the offset length is equal to the width of the sidewall insulator 2106a (the sidewall insulator 2106b).

Figure 17A:
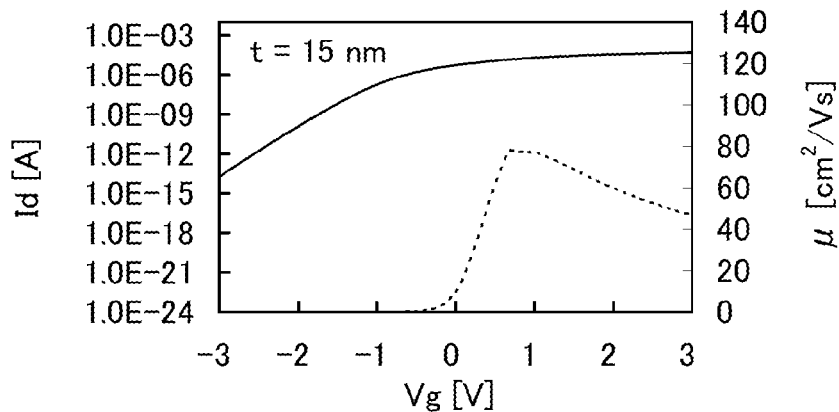
FIGS. 17A to 17C are each a graph showing gate voltage dependence of drain current and mobility obtained by calculation.
Figure 17B:
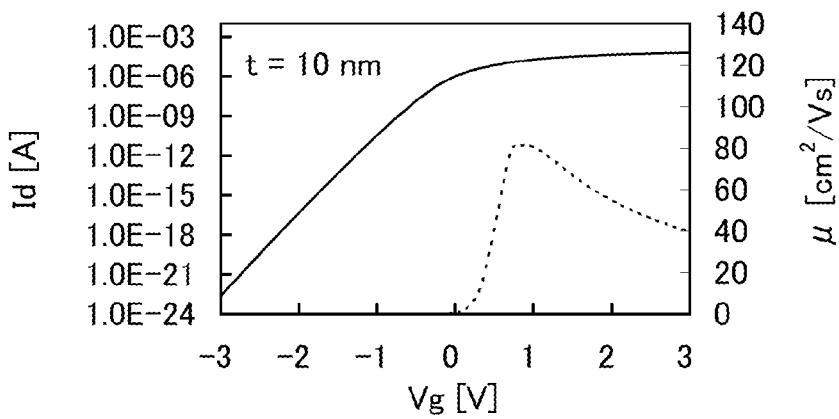
Figure 17C:
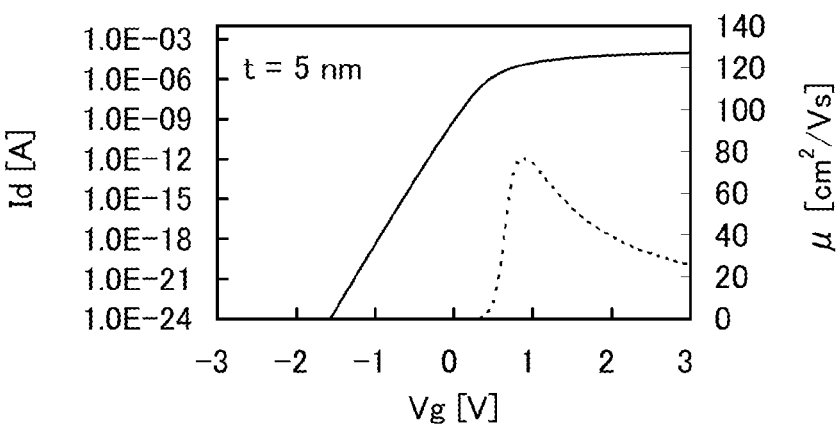

The other parameters used in calculation are as described above. For the calculation, device simulation software Sentaurus Device manufactured by Synopsys, Inc. was used. FIGS. 17A to 17C show the gate voltage ($V_g$: a potential difference between the gate and the source) dependence of the drain current ($I_d$, a solid line) and the mobility (μ, a dotted line) of the transistor having the structure illustrated in FIG. 20A. The drain current $I_d$ is obtained by calculation under the assumption that the drain voltage (a potential difference between the drain and the source) is +1 V and the mobility μ is obtained by calculation under the assumption that the drain voltage is +0.1 V.

FIG. 17A shows the gate voltage dependence of the transistor in the case where the thickness of the gate insulating layer is 15 nm, FIG. 17B shows that of the transistor in the case where the thickness of the gate insulating layer is 10 nm, and FIG. 17C shows that of the transistor in the case where the thickness of the gate insulating layer is 5 nm. As the gate insulating layer is thinner, the drain current $I_d$ (off-state current) particularly in an off state is significantly decreased. In contrast, there is no noticeable change in the peak value of the mobility μ and the drain current $I_d$ in an on state (on-state current). The graphs show that the drain current exceeds 10 μA at a gate voltage of around 1 V.

Figure 18A:
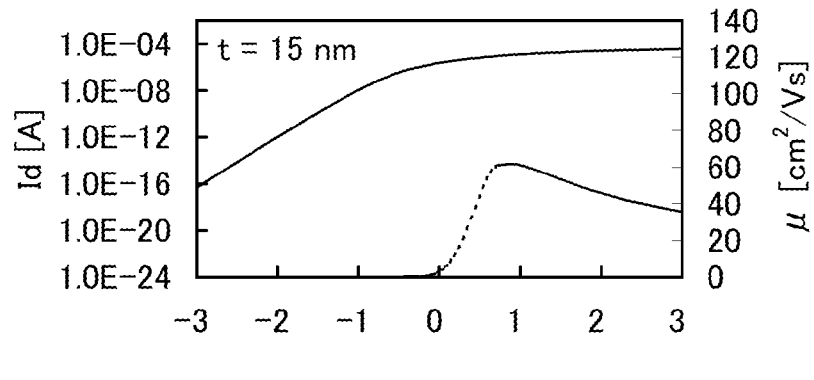
FIGS. 18A to 18C are each a graph showing gate voltage dependence of drain current and mobility obtained by calculation.
Figure 18B:
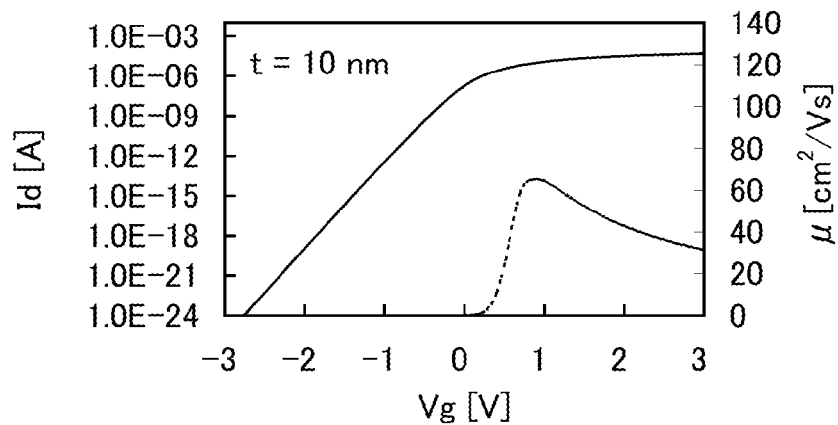
Figure 18C:
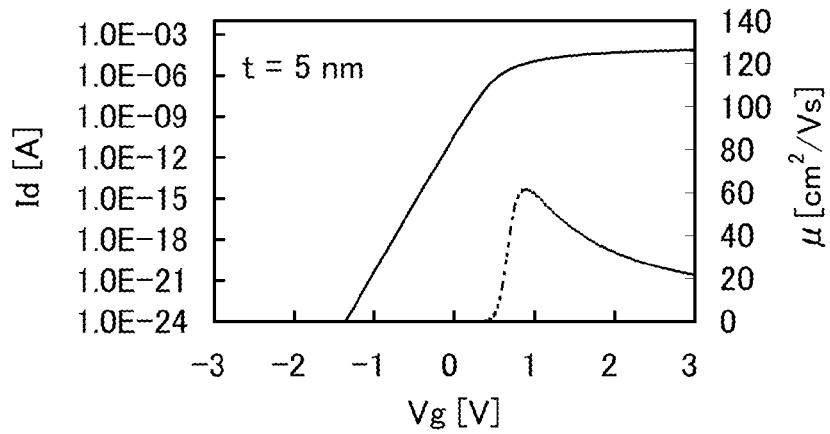

FIGS. 18A to 18C show the gate voltage $V_g$ dependence of the drain current $I_d$ (a solid line) and the mobility μ (a dotted line) of the transistor having the structure illustrated in FIG. 20B where the offset length $L_{off}$ is 5 nm. The drain current $I_d$ is obtained by calculation under the assumption that the drain voltage is +1 V and the mobility μ is obtained by calculation under the assumption that the drain voltage is +0.1 V. FIG. 18A shows the gate voltage dependence of the transistor in the case where the thickness of the gate insulating layer is 15 nm, FIG. 18B shows that of the transistor in the case where the thickness of the gate insulating layer is 10 nm, and FIG. 18C shows that of the transistor in the case where the thickness of the gate insulating layer is 5 nm.

Figure 19A:
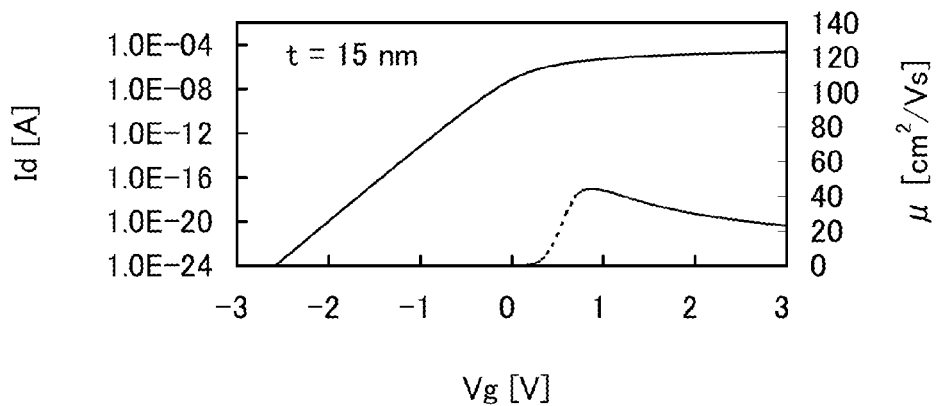
FIGS. 19A to 19C are each a graph showing gate voltage dependence of drain current and mobility obtained by calculation.
Figure 19B:
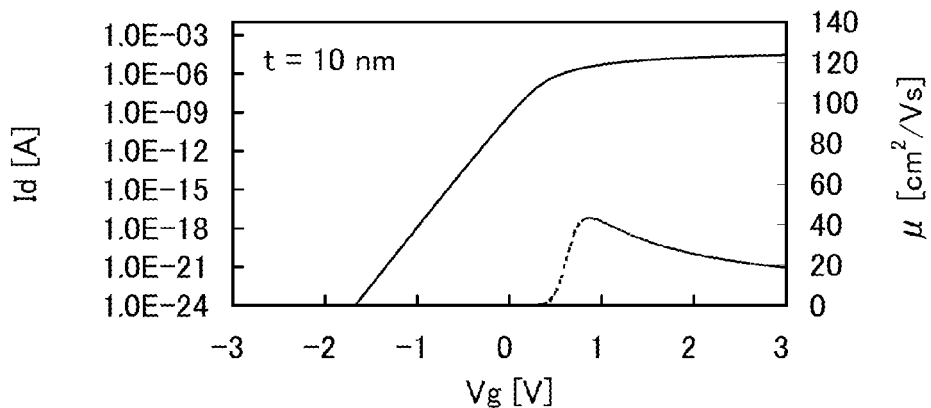
Figure 19C:
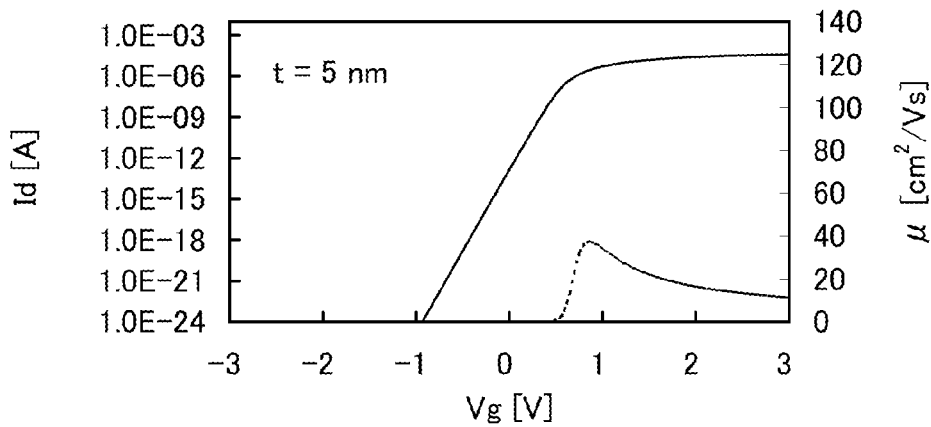

Further, FIGS. 19A to 19C show the gate voltage dependence of the drain current $I_d$ (a solid line) and the mobility μ (a dotted line) of the transistor having the structure illustrated in FIG. 20B where the offset length $L_{off}$ is 15 nm. The drain current $I_d$ is obtained by calculation under the assumption that the drain voltage is +1 V and the mobility μ is obtained by calculation under the assumption that the drain voltage is +0.1 V. FIG. 19A shows the gate voltage dependence of the transistor in the case where the thickness of the gate insulating layer is 15 nm, FIG. 19B shows that of the transistor in the case where the thickness of the gate insulating layer is 10 nm, and FIG. 19C shows that of the transistor in the case where the thickness of the gate insulating layer is 5 nm.

In either of the structures, as the gate insulating layer is thinner, the off-state current is significantly decreased, whereas no noticeable change arises in the peak value of the mobility μ and the on-state current.

Note that the peak of the mobility μ is approximately 80 cm²/Vs in FIGS. 17A to 17C, approximately 60 cm²/Vs in FIGS. 18A to 18C, and approximately 40 cm²/Vs in FIGS. 19A to 19C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA at a gate voltage of around 1 V.

Embodiment 7

In this embodiment, a transistor in which an oxide semiconductor including In, Sn, and Zn as main components is used as an oxide semiconductor will be described.

A transistor in which an oxide semiconductor including In, Sn, and Zn as main components is used as a channel formation region can have favorable characteristics by depositing the oxide semiconductor while heating a substrate or by performing heat treatment after an oxide semiconductor film is formed. Note that a main component refers to an element included in composition at 5 atomic % or more.

By intentionally heating the substrate after formation of the oxide semiconductor film including In, Sn, and Zn as main components, the field-effect mobility of the transistor can be improved. Further, the threshold voltage of the transistor can be positively shifted to make the transistor normally off.

Figure 21A:
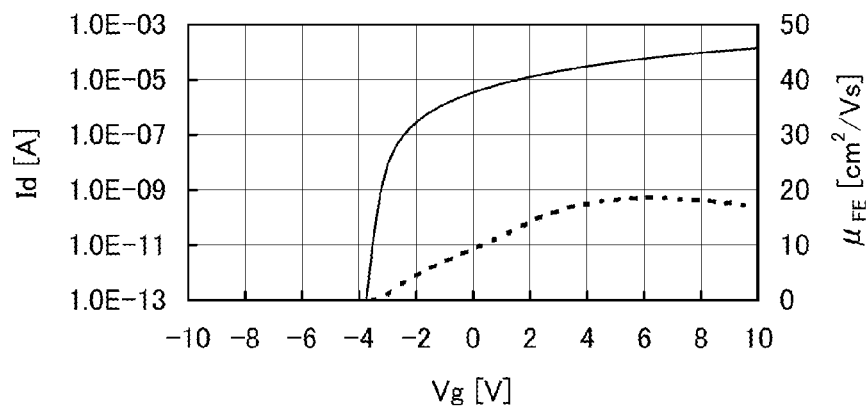
FIGS. 21A to 21C are each a graphs showing characteristics of a transistor.
Figure 21B:
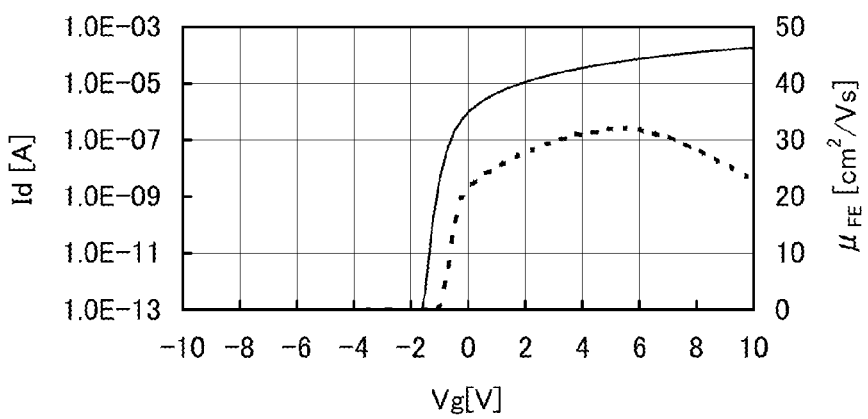
Figure 21C:
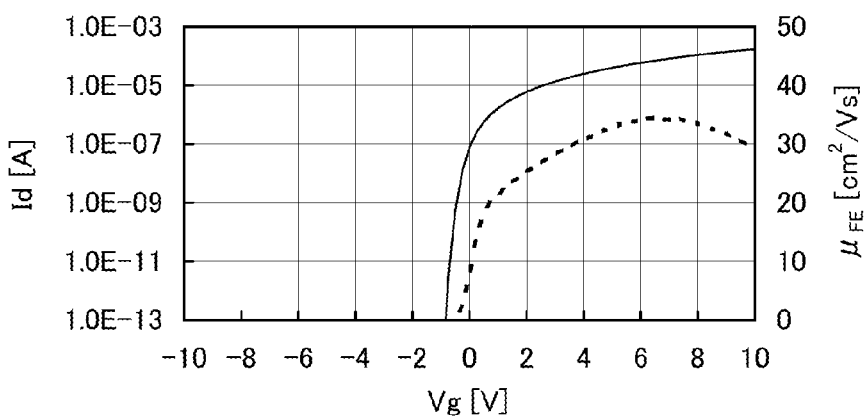

As an example, FIGS. 21A to 21C each show characteristics of a transistor that includes an oxide semiconductor film including In, Sn, and Zn as main components and having a channel length L of 3 μm and a channel width W of 10 μm, and a gate insulating layer with a thickness of 100 nm. Note that $V_d$ was set to 10 V.

FIG. 21A shows characteristics of a transistor whose oxide semiconductor film including In, Sn, and Zn as main components was formed by a sputtering method without heating a substrate intentionally. The field-effect mobility of the transistor is 18.8 cm$^2$/Vsec. On the other hand, when the oxide semiconductor film including In, Sn, and Zn as main components is formed while heating the substrate intentionally, the field-effect mobility can be improved. FIG. 21B shows characteristics of a transistor whose oxide semiconductor film including In, Sn, and Zn as main components was formed while heating a substrate at 200° C. The field-effect mobility of the transistor is 32.2 cm$^2$/Vsec.

The field-effect mobility can be further improved by performing heat treatment after formation of the oxide semiconductor film including In, Sn, and Zn as main components. FIG. 21C shows characteristics of a transistor whose oxide semiconductor film including In, Sn, and Zn as main components was formed by a sputtering method at 200° C. and then subjected to heat treatment at 650° C. The field-effect mobility of the transistor is 34.5 cm$^2$/Vsec.

The intentional heating of the substrate is expected to have an effect of reducing moisture taken into the oxide semiconductor film during the deposition by sputtering. Further, the heat treatment after deposition enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being highly purified by removal of impurities from the oxide semiconductor. In the case of using such a purified non-single-crystal oxide semiconductor, ideally, a field-effect mobility exceeding 100 cm$^2$/Vsec is expected to be achieved.

The oxide semiconductor including In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by heat treatment performed later. By such crystallization treatment or recrystallization treatment, a non-single crystal oxide semiconductor having favorable crystallinity can be obtained.

The intentional heating of the substrate during deposition and/or the heat treatment after the deposition contributes not only to improving field-effect mobility but also to making the transistor normally off. In a transistor in which an oxide semiconductor film that includes In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 21A and 21B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When deposition or heat treatment is performed at a high temperature, the transistor can be normally off.

By intentionally heating the substrate during deposition and/or by performing heat treatment after the deposition, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$–$I_d$ characteristics of the transistors were measured at a substrate temperature of 25° C. and $V_d$ of 10 V. Then, the substrate temperature was set to 150° C. and $V_d$ was set to 0.1 V. After that, 20 V of $V_g$ was applied so that the intensity of an electric field applied to gate insulating layers was 2 MV/cm, and the condition was kept for one hour. Next, $V_g$ was set to 0 V. Then, $V_g$–$I_d$ characteristics of the transistors were measured at a substrate temperature of 25° C. and $V_d$ of 10 V. This process is called a positive BT test.

In a similar manner, first, $V_g$–$I_d$ characteristics of the transistors were measured at a substrate temperature of 25° C. and $V_d$ of 10 V. Then, the substrate temperature was set to 150° C. and $V_d$ was set to 0.1 V. After that, −20 V of $V_g$ was applied so that the intensity of an electric field applied to the gate insulating layers was −2 MV/cm, and the condition was kept for one hour. Next, $V_g$ was set to 0 V. Then, $V_g$–$I_d$ characteristics of the transistors were measured at a substrate temperature of 25° C. and $V_d$ of 10 V. This process is called a negative BT test.

Figure 22A:
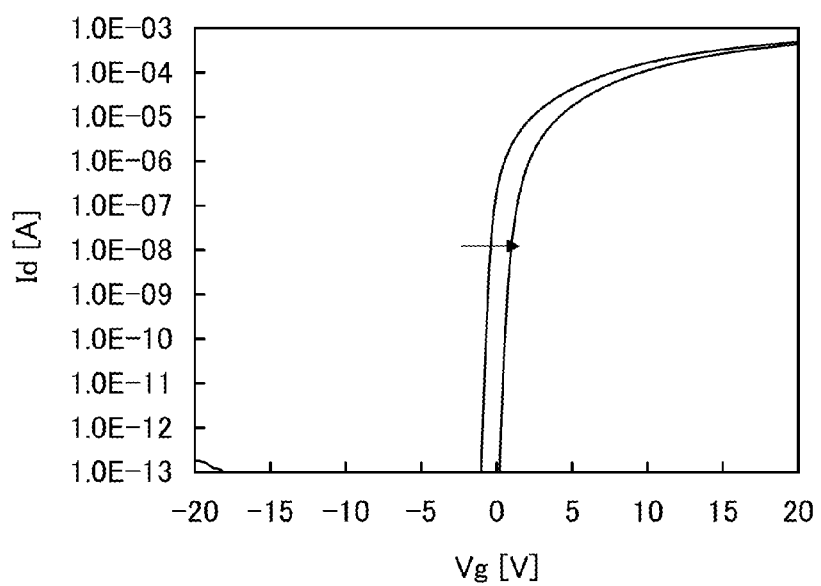
FIGS. 22A and 22B each show characteristics of a transistor.
Figure 22B:
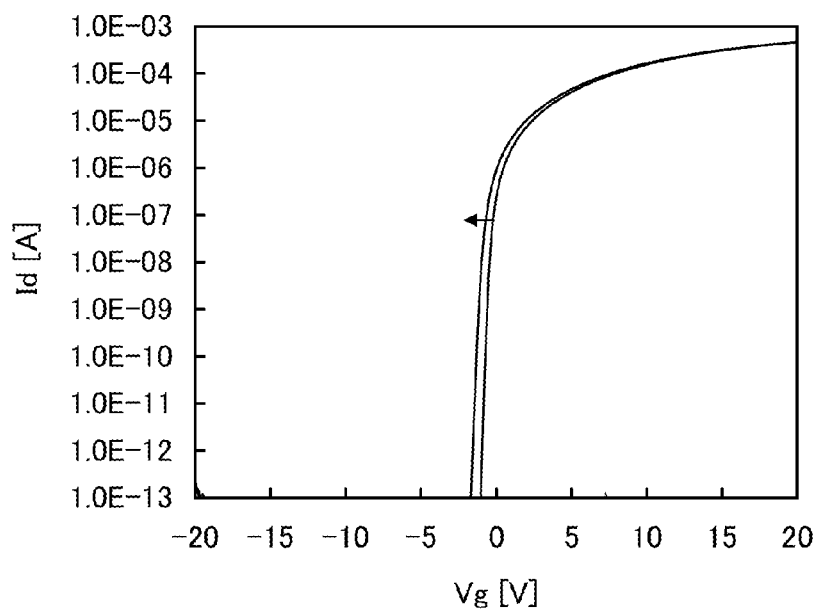
Figure 23A:
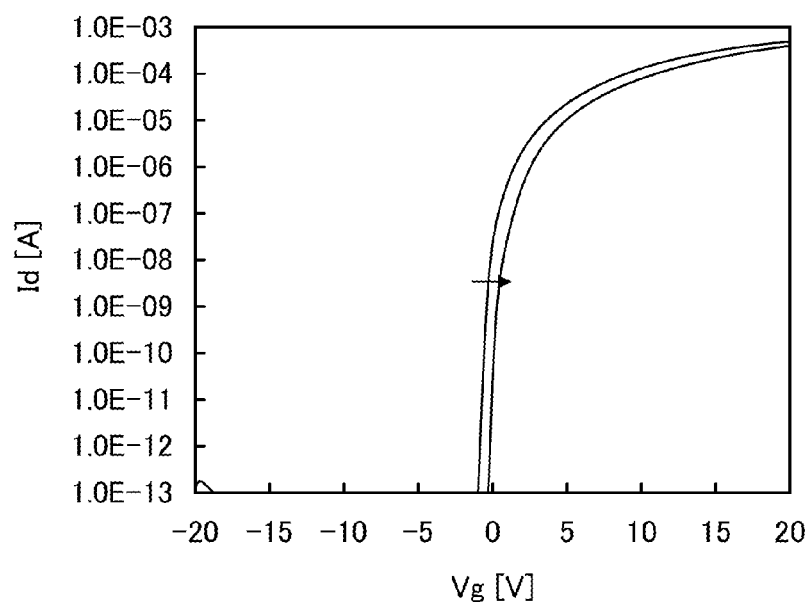
FIGS. 23A and 23B each show characteristics of a transistor.
Figure 23B:
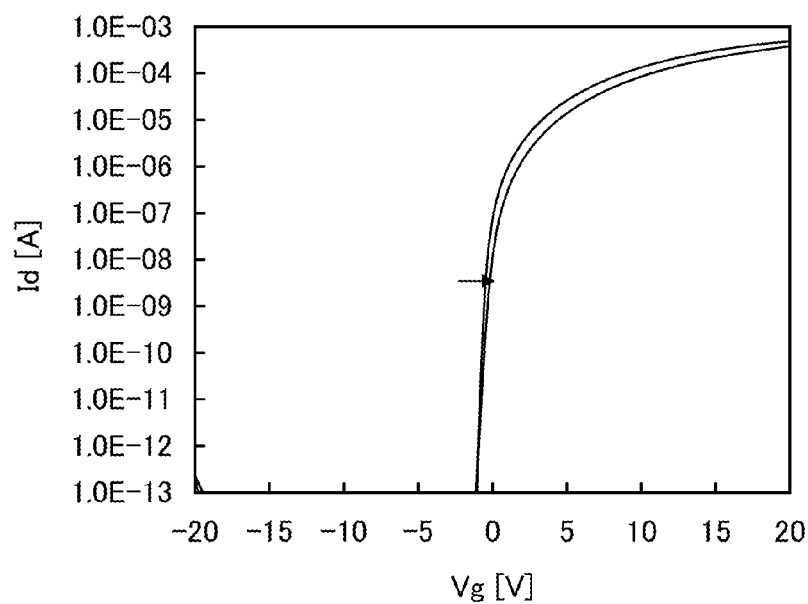

FIGS. 22A and 22B show results of the positive BT test and the negative BT test, respectively, of Sample 1. FIGS. 23A and 23B show results of the positive BT test and the negative BT test, respectively, of Sample 2.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability thereof is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a stacked film; however, when excess oxygen is included in the oxide semiconductor by the heat treatment, oxygen deficiency caused constantly can be compensated for with excess oxygen. The excess oxygen is mainly oxygen existing between lattices. When the concentration of oxygen is set in the range of $1 \times 10^{16}/cm^3$ to $2 \times 10^{20}/cm^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target of In:Sn:Zn=1:1:1 [atomic ratio] was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 26:
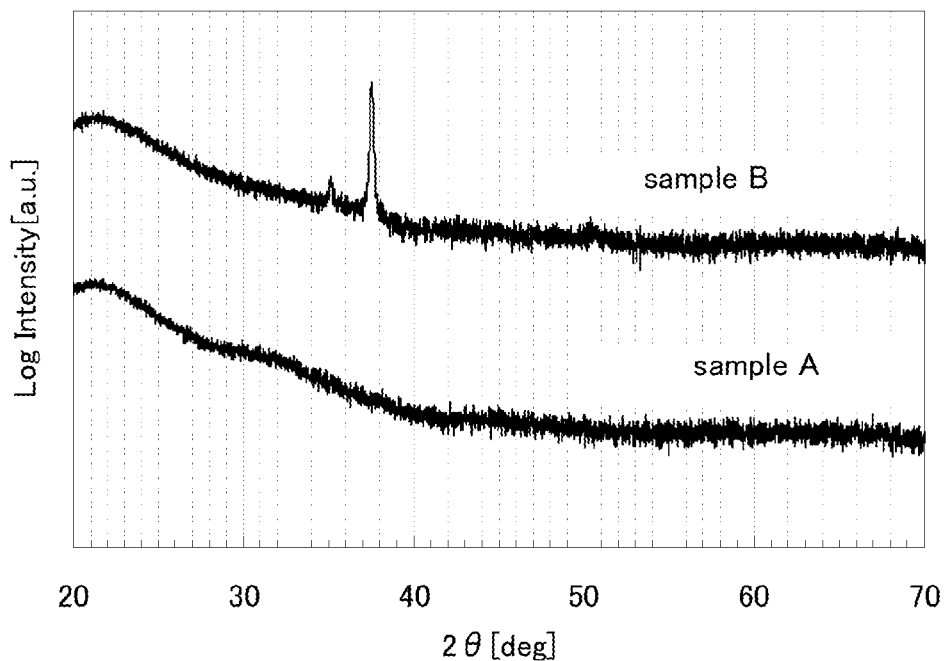
FIG. 26 shows XRD spectra of oxide materials.

FIG. 26 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current represents current per micrometer of a channel width.

Figure 27:
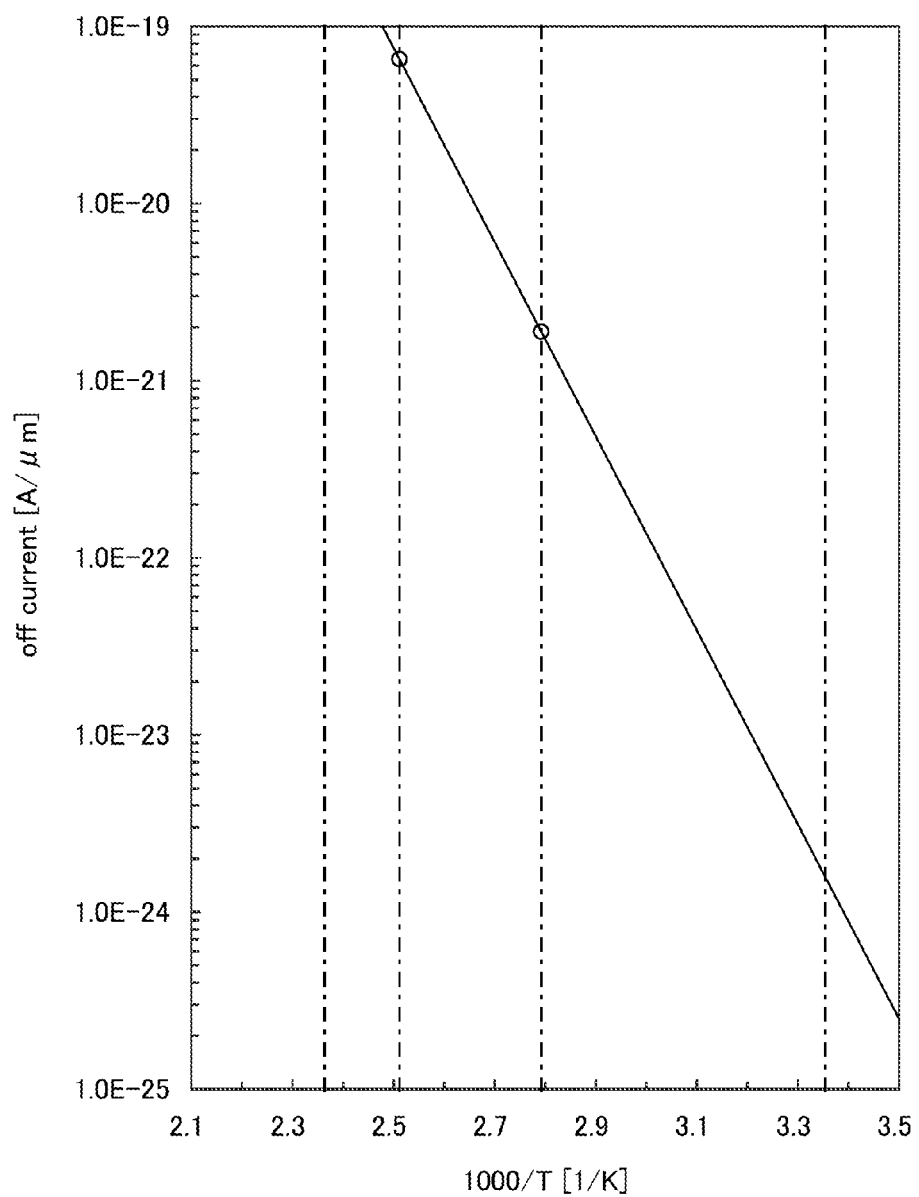
FIG. 27 shows characteristics of a transistor.

FIG. 27 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 27, the off-state current can be 1 aA/μm ($1 \times 10^{-18}$ A/μm) or lower, 100 zA/μm ($1 \times 10^{-19}$ A/μm) or lower, and 1 zA/μm ($1 \times 10^{-21}$ A/μm) or lower when the substrate temperature is 125° C., 85° C., and room temperature (27° C.), respectively. Preferably, the off-state current can be 0.1 aA/μm ($1 \times 10^{-19}$ A/μm) or lower, 10 zA/μm ($1 \times 10^{-2}$ A/μm) or lower, and 0.1 zA/μm ($1 \times 10^{-22}$ A/μm) or lower at 125° C., 85° C., and room temperature, respectively.

Note that in order to prevent hydrogen and moisture from being included in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is highly purified so as not to include impurities such as hydrogen and moisture. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of a transistor of Sample B, on which heat treatment at 650° C. was performed after formation of the oxide semiconductor film, was evaluated.

The transistor used for the measurement has a channel length L of 3 μm, a channel width W of 10 μm, $L_{ov}$ of 0 μm, and dW of 0 μm. Note that $V_d$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as $L_{ov}$, and the width of a portion of the pair of electrodes, which does not overlap with an oxide semiconductor film, is referred to as dW.

Figure 24:
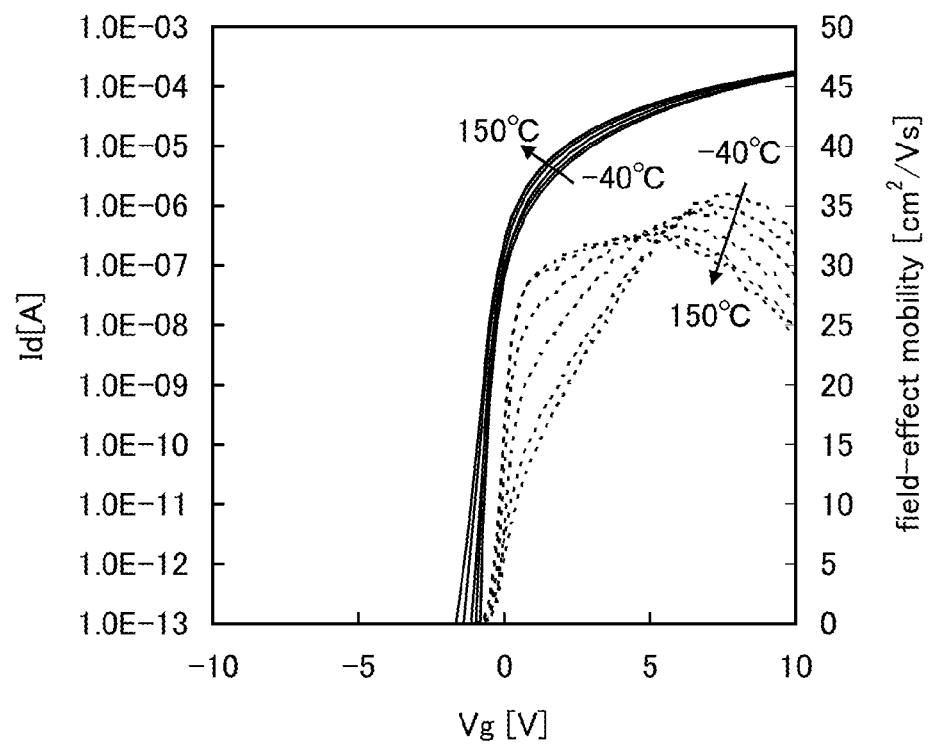
FIG. 24 shows characteristics of a transistor.
Figure 25A:
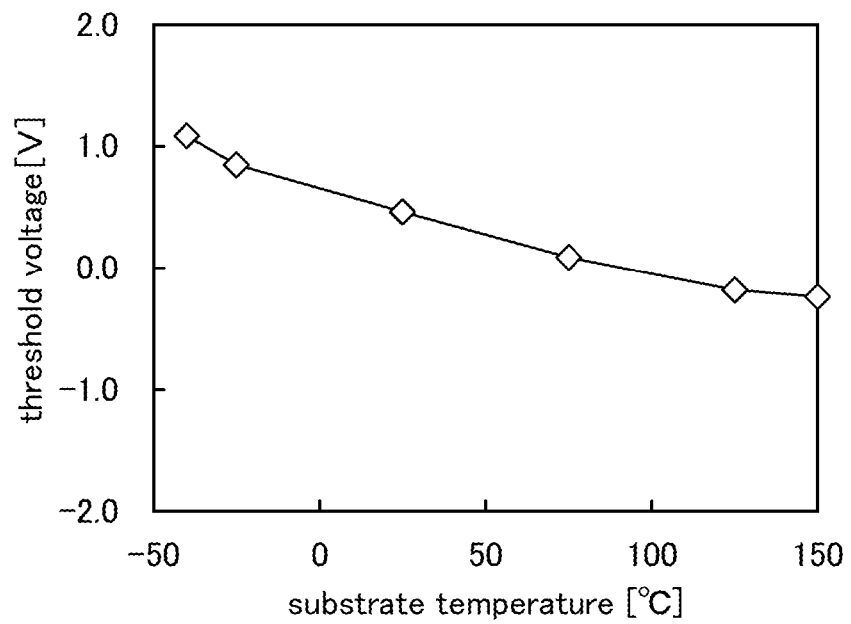
FIGS. 25A and 25B show characteristics of a transistor.

FIG. 24 shows the $V_g$ dependence of $I_d$ (a solid line) and field-effect mobility (a dotted line). FIG. 25A shows a relation between the substrate temperature and the threshold voltage, and FIG. 25B shows a relation between the substrate temperature and the field-effect mobility.

From FIG. 25A, it is found that the threshold voltage gets lower as the substrate temperature increases. Note that the threshold voltage is decreased from 1.09 V to −0.23 V in the range from −40° C. to 150° C.

Figure 25B:
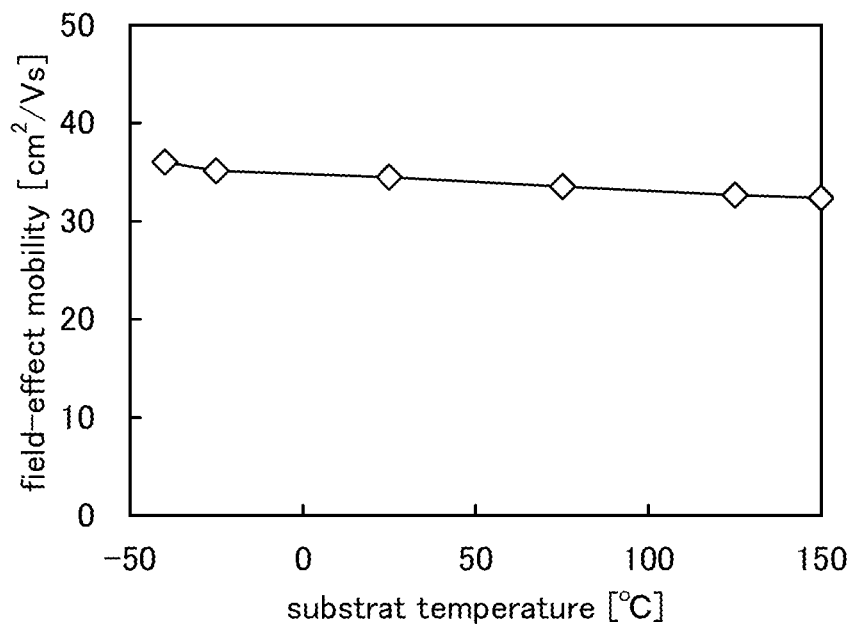

From FIG. 25B, it is found that the field-effect mobility gets lower as the substrate temperature increases. Note that the field-effect mobility is decreased from 36 cm²/Vs to 32 cm²/Vs in the range from −40° C. to 150° C. Thus, it is found that variation in electric characteristics is small in the above temperature range.

In a transistor in which such an oxide semiconductor including In, Sn, and Zn as main components is used as a channel formation region, a field-effect mobility of 30, CM²/Vsec or higher, preferably 40 cm²/Vsec or higher, further preferably 60 cm$^2$/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

An example of a transistor in which an In—Sn—Zn—O film is used as an oxide semiconductor film will be described below.

Figure 28A:
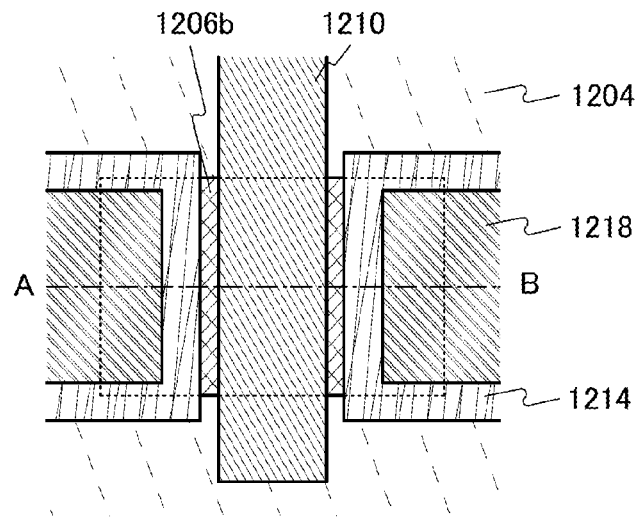
FIGS. 28A and 28B are a plan view and a cross-sectional view of a semiconductor device.
Figure 28B:
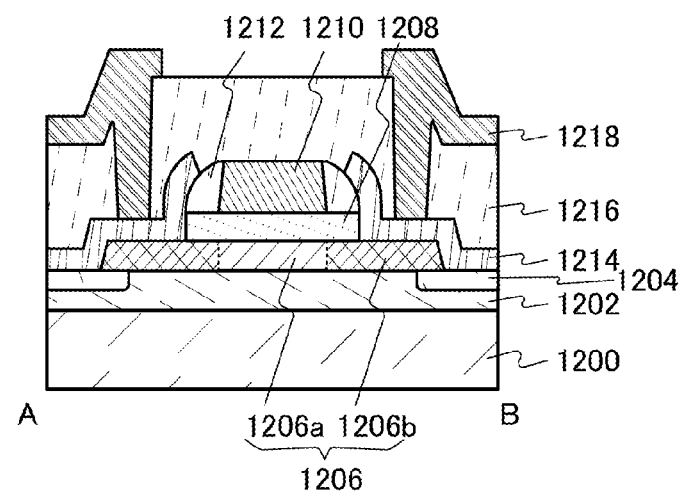

FIGS. 28A and 28B are a top view and a cross-sectional view of a coplanar transistor having a top-gate top-contact structure. FIG. 28A is the top view of the transistor. FIG. 28B illustrates cross section A-B along dashed-dotted line A-B in FIG. 28A.

The transistor illustrated in FIG. 28B includes a substrate 1200; a base insulating layer 1202 provided over the substrate 1200; a protective insulating film 1204 provided in the periphery of the base insulating layer 1202; an oxide semiconductor film 1206 that is provided over the base insulating layer 1202 and the protective insulating film 1204 and includes a high-resistance region 1206a and low-resistance regions 1206b; a gate insulating layer 1208 provided over the oxide semiconductor film 1206; a gate electrode 1210 provided to overlap with the oxide semiconductor film 1206 with the gate insulating layer 1208 provided therebetween; a sidewall insulating film 1212 provided in contact with a side surface of the gate electrode 1210; a pair of electrodes 1214 provided in contact with at least the low-resistance regions 1206b; an interlayer insulating film 1216 provided to cover at least the oxide semiconductor film 1206, the gate electrode 1210, and the pair of electrodes 1214; and a wiring 1218 provided to be connected to at least one of the pair of electrodes 1214 through an opening formed in the interlayer insulating film 1216.

Although not illustrated, a protective film may be provided to cover the interlayer insulating film 1216 and the wiring 1218. With the protective film, a minute amount of leakage current generated by surface conduction of the interlayer insulating film 1216 can be reduced and thus the off-state current of the transistor can be reduced.

Another example of a transistor in which an In—Sn—Zn—O film is used as an oxide semiconductor film will be described below.

Figure 29A:
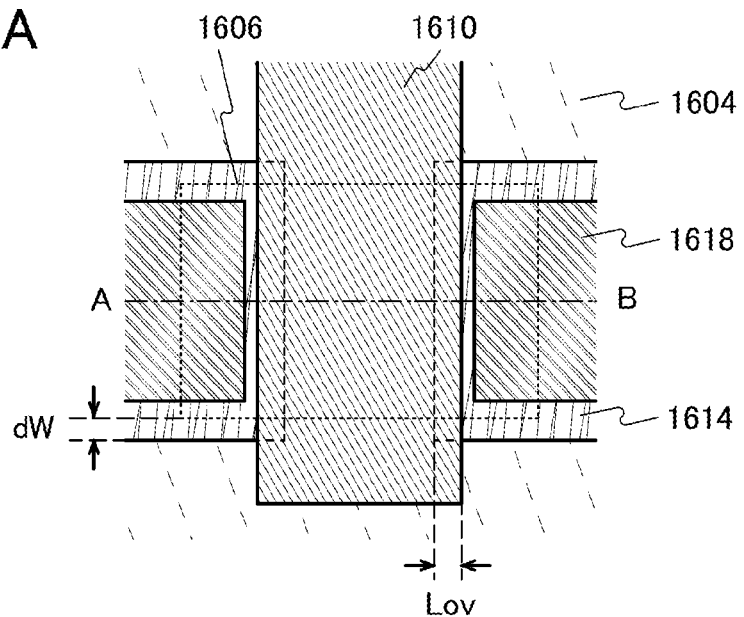
FIGS. 29A and 29B are a plan view and a cross-sectional view of a semiconductor device.
Figure 29B:
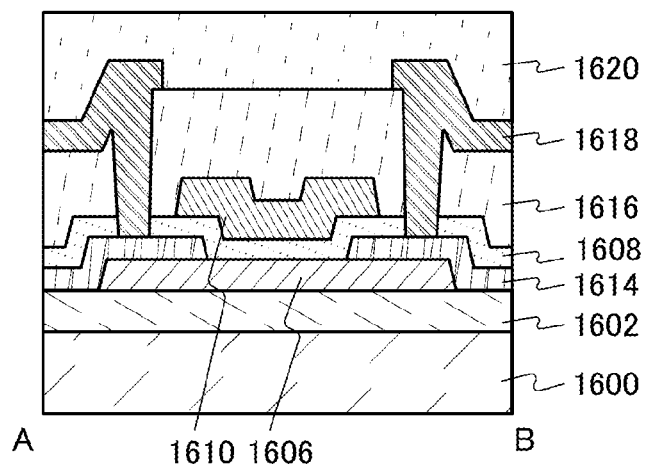

FIGS. 29A and 29B are a top view and a cross-sectional view illustrating a structure of a transistor. FIG. 29A is the top view of the transistor. FIG. 29B is a cross-sectional view along dashed-dotted line A-B in FIG. 29A.

The transistor illustrated in FIG. 29B includes a substrate 1600; a base insulating layer 1602 provided over the substrate 1600; an oxide semiconductor film 1606 provided over the base insulating layer 1602; a pair of electrodes 1614 in contact with the oxide semiconductor film 1606; a gate insulating layer 1608 provided over the oxide semiconductor film 1606 and the pair of electrodes 1614; a gate electrode 1610 provided to overlap with the oxide semiconductor film 1606 with the gate insulating layer 1608 provided therebetween; an interlayer insulating film 1616 provided to cover the gate insulating layer 1608 and the gate electrode 1610; wirings 1618 connected to the pair of electrodes 1614 through openings formed in the interlayer insulating film 1616; and a protective film 1620 provided to cover the interlayer insulating film 1616 and the wirings 1618.

As the substrate 1600, a glass substrate can be used. As the base insulating layer 1602, a silicon oxide film can be used. As the oxide semiconductor film 1606, an In—Sn—Zn—O film can be used. As the pair of electrodes 1614, a tungsten film can be used. As the gate insulating layer 1608, a silicon oxide film can be used. The gate electrode 1610 can have a stacked structure of a tantalum nitride film and a tungsten film. The interlayer insulating film 1616 can have a stacked structure of a silicon oxynitride film and a polyimide film. The wirings 1618 can each have a stacked structure in which a titanium film, an aluminum film, and a titanium film are formed in this order. As the protective film 1620, a polyimide film can be used.

Note that in the transistor having the structure illustrated in FIG. 29A, the width of a portion where the gate electrode 1610 overlaps with one of the pair of electrodes 1614 is referred to as $L_{OV}$. Similarly, the width of a portion of the pair of electrodes 1614, which does not overlap with the oxide semiconductor film 1606, is referred to as dW.

Embodiment 8

In this embodiment, examples of electronic devices each including the semiconductor device in the above embodiment are described.

Examples of structures of electronic devices in this embodiment are described with reference to FIGS. 12A to 12D.

Figure 12A:
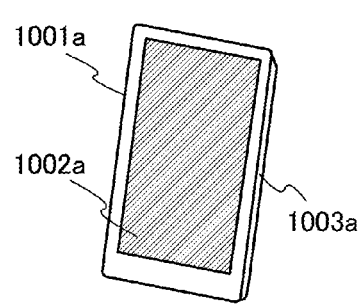
FIGS. 12A to 12D are schematic views illustrating examples of electronic devices in Embodiment 8.

The electronic device illustrated in FIG. 12A is an example of a personal digital assistant. The personal digital assistant illustrated in FIG. 12A includes a housing 1001a and a display portion 1002a provided in the housing 1001a.

Note that a side surface 1003a of the housing 1001a may be provided with a connection terminal for connecting the personal digital assistant to an external device and/or a button for operating the personal digital assistant illustrated in FIG. 12A.

The personal digital assistant illustrated in FIG. 12A includes a CPU, a memory circuit, an interface for transmitting and receiving a signal between the external device and each of the CPU and the memory circuit, and an antenna for transmitting and receiving a signal to and from the external device, in the housing 1001a.

The personal digital assistant illustrated in FIG. 12A serves as one or more of a telephone set, an e-book reader, a personal computer, and a game machine, for example.

Figure 12C:
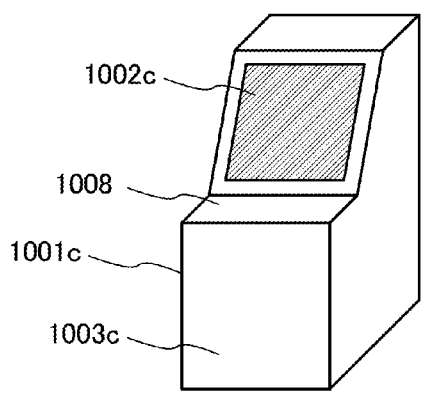
Figure 12B:
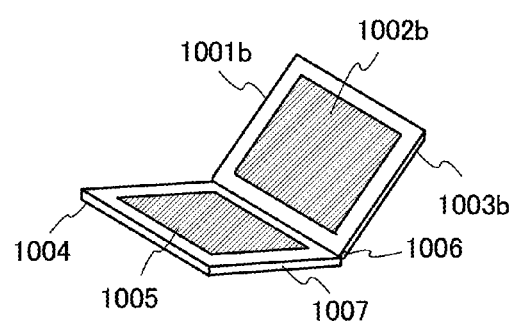

The electronic device illustrated in FIG. 12B is an example of a folding personal digital assistant. The personal digital assistant illustrated in FIG. 12B includes a housing 1001b, a display portion 1002b provided in the housing 1001b, a housing 1004, a display portion 1005 provided in the housing 1004, and a hinge 1006 for connecting the housing 1001b and the housing 1004.

In the personal digital assistant illustrated in FIG. 12B, the housing 1001b can be stacked on the housing 1004 by moving the housing 1001b or the housing 1004 with the hinge 1006.

Note that a side surface 1003b of the housing 1001b or a side surface 1007 of the housing 1004 may be provided with a connection terminal for connecting the personal digital assistant to an external device and/or a button for operating the personal digital assistant illustrated in FIG. 12B.

The display portion 1002b and the display portion 1005 may display different images or one image. Note that the display portion 1005 is not necessarily provided, and a keyboard which is an input device may be provided instead of the display portion 1005.

The personal digital assistant illustrated in FIG. 12B includes a CPU, a memory circuit, and an interface for transmitting and receiving a signal between the external device and each of the CPU and the memory circuit in the housing 1001b or the housing 1004. Note that the personal digital assistant illustrated in FIG. 12B may include an antenna for transmitting and receiving a signal to and from the external device.

The personal digital assistant illustrated in FIG. 12B serves as one or more of a telephone set, an e-book reader, a personal computer, and a game machine, for example.

The electronic device illustrated in FIG. 12C is an example of a stationary information terminal. The stationary information terminal illustrated in FIG. 12C includes a housing 1001c and a display portion 1002c provided in the housing 1001c.

Note that the display portion 1002c can be provided on a deck portion 1008 in the housing 1001c.

The stationary information terminal illustrated in FIG. 12C includes a CPU, a memory circuit, and an interface for transmitting and receiving a signal between the external device and each of the CPU and the memory circuit in the housing 1001c. Note that the stationary information terminal illustrated in FIG. 12C may include an antenna for transmitting and receiving a signal to and from the external device.

Further, a side surface 1003c of the housing 1001c in the stationary information terminal illustrated in FIG. 12C may be provided with one or more of a ticket output portion that outputs a ticket or the like, a coin slot, and a bill slot.

The stationary information terminal illustrated in FIG. 12C serves as an automated teller machine, an information communication terminal (also referred to as a multimedia station) for ordering a ticket or the like, or a game machine, for example.

Figure 12D:
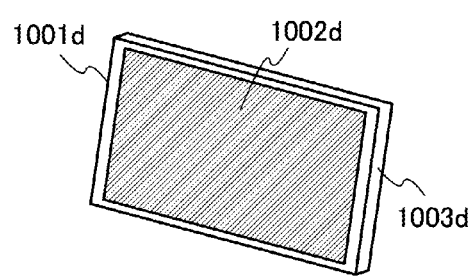

The electronic device illustrated in FIG. 12D is an example of a stationary information terminal. The stationary information terminal illustrated in FIG. 12D includes a housing 1001d and a display portion 1002d provided in the housing 1001d. Note that a support for supporting the housing 1001d may also be provided.

Note that a side surface 1003d of the housing 1001d may be provided with a connection terminal for connecting the stationary information terminal to an external device and/or a button for operating the stationary information terminal illustrated in FIG. 12D.

The stationary information terminal illustrated in FIG. 12D may include a CPU, a memory circuit, and an interface for transmitting and receiving a signal between the external device and each of the CPU and the memory circuit in the housing 1001d. Note that the stationary information terminal illustrated in FIG. 12D may include an antenna for transmitting and receiving a signal to and from the external device.

The stationary information terminal illustrated in FIG. 12D serves as a digital photo frame, a monitor, or a television set, for example.

The semiconductor device in the above embodiment is used as a CPU in an electronic device, for example. For example, the semiconductor device in the above embodiment is used as one of the CPUs in the electronic devices illustrated in FIGS. 12A to 12D.

As described with reference to FIGS. 12A to 12D, the examples of the electronic devices in this embodiment each include a CPU which includes the semiconductor device in the above embodiment.

With such a structure, even when power is not supplied, data in an electronic device can be retained for a certain period. Thus, a time after the supply of the power supply voltage starts until a normal operation starts can be shortened and power consumption can be reduced.

EXPLANATION OF REFERENCE

100a: transistor, 100b: transistor, 101: semiconductor layer, 102: insulating layer, 103_a: region, 103_b1: region, 103_b2: region, 103_c: region, 104: insulating layer, 105: conductive layer, 106: insulating layer, 107: semiconductor layer, 107_a: region, 107_b1: region, 107_b2: region, 108a: conductive layer, 108b: conductive layer, 108c: conductive layer, 108d: conductive layer, 108e: conductive layer, 109: insulating layer, 110: conductive layer, 111a: opening, 111b: opening, 111c: opening, 200a: transistor, 200b: transistor, 200c: transistor, 201: semiconductor layer, 201_a: region, 201_b: region, 202: insulating layer, 203a a: region, 203a_b1: region, 203a b2: region, 203b: semiconductor layer, 203b_a: region, 203b_b1: region, 203b_b2: region, 204: insulating layer, 205a: conductive layer, 205b: conductive layer, 206: insulating layer, 207: semiconductor layer, 207_a: region, 207_b1: region, 207_b2: region, 208a: conductive layer, 208b: conductive layer, 208c: conductive layer, 208d: conductive layer, 208e: conductive layer, 208f: conductive layer, 208g: conductive layer, 208h: conductive layer, 209: insulating layer, 210: conductive layer, 300a: transistor, 300b, transistor, 301: semiconductor layer, 301a: region, 302: insulating layer, 303: semiconductor layer, 303_a: region, 303_b1: region, 303_b2: region, 303_c: region, 304: insulating layer, 305: conductive layer, 306: insulating layer, 307: semiconductor layer, 307_a: region, 307_b1: region, 307_b2: region, 308a: conductive layer; 308b: conductive layer; 308c: conductive layer; 308d: conductive layer; 309: insulating layer; 310a: conductive layer; 310b: conductive layer; 501: bus interface; 502: control unit; 503: cache memory; 504: register; 505: instruction decoder; 506: arithmetic logic unit; 611: analog switch; 612: NOT gate; 613: transistor; 614: capacitor; 615: NOT gate; 616: NAND gate; 617: clocked inverter; 618: analog switch; 619: NOT gate; 620: clocked NAND gate; 621: NOT gate; 651: larch circuit; 652: larch circuit; 691: period; 692: period; 693: period; 701: transistor; 702: transistor; 703: memory circuit; 704: capacitor; 705: NOT gate; 706: switching circuit; 707: memory circuit; 751: transistor; 752: transistor; 753: capacitor; 1001a: housing; 1001b: housing; 1001c: housing; 1001d: housing; 1002a: display portion; 1002b: display portion; 1002c: display portion; 1002d: display portion; 1003a: side surface; 1003b: side surface; 1003c: side surface; 1003d: side surface; 1004: housing; 1005: display portion; 1006: hinge; 1007: side surface; 1008: deck portion; 1200: substrate; 1202: base insulating layer; 1204: protective insulating film; 1206: oxide semiconductor film; 1206a: high-resistance region; 1206b: low-resistance region; 1208: gate insulating layer; 1210: gate electrode; 1212: sidewall insulating film; 1214: electrode; 1216: interlayer insulating film; 1218: wiring; 1600: substrate; 1602: base insulating layer; 1606: oxide semiconductor film; 1608: gate insulating layer; 1610: gate electrode; 1614: wiring; 1616: interlayer insulating film; 1618: wiring; 1620: protective film; 2101: base insulating layer; 2102: insulator; 2103a: semiconductor region; 2103b: semiconductor region; 2103c: semiconductor region; 2104: gate insulating layer; 2105: gate; 2106*a*: sidewall insulator; 2106*b*: sidewall insulator; 2107: insulator; 2108*a*: source; 2108*b*: drain;

This application is based on Japanese Patent Application serial No. 2011-015871 filed with Japan Patent Office on Jan. 28, 2011 and Japanese Patent Application serial No. 2011-108880 filed with Japan Patent Office on May 14, 2011, the entire contents of which are hereby incorporated by reference.

The invention claimed is:

1. A semiconductor device comprising:
   a first transistor comprising:
      a first semiconductor layer over a second semiconductor layer with a first insulating layer provided therebetween, wherein the first semiconductor layer comprises:
         a first region having a first conductivity type;
         a second region having the first conductivity type; and
         a third region in contact with the first region and the second region; and
      a first electrode over the third region of the first semiconductor layer with a second insulating layer provided therebetween;
      a second electrode over the second insulating layer, wherein the second electrode is electrically connected to the first region of the first semiconductor layer;
      a third electrode over the second insulating layer, wherein the third electrode is electrically connected to the second region of the first semiconductor layer; and
      a fourth electrode over the second insulating layer and electrically connected to the second semiconductor layer;
   a second transistor comprising a third semiconductor layer comprising oxide semiconductor, wherein the third semiconductor layer is provided over the second insulating layer,
   wherein the second semiconductor layer has a second conductivity type opposite to the first conductivity type.

2. The semiconductor device according to claim 1, wherein the oxide semiconductor comprises indium, gallium, and zinc.

3. The semiconductor device according to claim 1, wherein the second semiconductor layer overlaps with the third semiconductor layer.

4. The semiconductor device according to claim 1, wherein the second semiconductor layer is a silicon substrate.

5. The semiconductor device according to claim 1, wherein the first semiconductor layer comprises single crystal silicon.

6. An electronic device comprising a CPU comprising the semiconductor device according to claim 1, wherein the electronic device is one selected from the group consisting of a telephone set, an e-book reader, a personal computer, and a game machine.

* * * * *

UNITED STATES PATENT AND TRADEMARK OFFICE
CERTIFICATE OF CORRECTION

PATENT NO. : 8,937,304 B2
APPLICATION NO. : 13/356828
DATED : January 20, 2015
INVENTOR(S) : Masashi Fujita et al.

Page 1 of 1

It is certified that error appears in the above-identified patent and that said Letters Patent is hereby corrected as shown below:

In the Specification

Column 2, line 47, replace "SOT" with --SOI--;

Column 5, line 5, replace "SOT" with --SOI--;

Column 5, line 11, replace "SOT" with --SOI--;

Column 5, line 36, replace "103$b$2" with --103_$b$2--;

Column 6, line 48, replace "(A1)" with --(Al)--;

Column 7, line 47, replace "A1" with --Al--;

Column 9, line 45, replace "A1" with --Al--;

Column 9, line 54, replace "A1" with --Al--;

Column 11, line 50, replace "$H_2^+$" with --$H^+$--;

Column 22, line 9, replace "307$a$" with --307_$a$--; and

Column 30, line 41, after "half" insert --.--.

Signed and Sealed this
Twenty-ninth Day of September, 2015

Michelle K. Lee
*Director of the United States Patent and Trademark Office*